United States Patent
Lin et al.

(10) Patent No.: US 11,625,341 B2
(45) Date of Patent: Apr. 11, 2023

(54) NARROW DRAM CHANNEL SYSTEMS AND METHODS

(71) Applicant: Alibaba Group Holding Limited, Grand Cayman (KY)

(72) Inventors: Jilan Lin, Goleta, CA (US); Dimin Niu, Sunnyvale, CA (US); Shuangchen Li, Sunnyvale, CA (US); Hongzhong Zheng, Los Gatos, CA (US); Yuan Xie, Sunnyvale, CA (US)

(73) Assignee: Alibaba Group Holding Limited, Grand Cayman (KY)

( * ) Notice: Subject to any disclaimer, the term of this patent is extended or adjusted under 35 U.S.C. 154(b) by 0 days.

(21) Appl. No.: 16/990,776

(22) Filed: Aug. 11, 2020

(65) Prior Publication Data
US 2022/0050794 A1 Feb. 17, 2022

(51) Int. Cl.
| | |
|---|---|
| *G06F 13/16* | (2006.01) |
| *G06F 12/00* | (2006.01) |
| *G11C 7/10* | (2006.01) |
| *G06F 9/448* | (2018.01) |
| *G06F 12/02* | (2006.01) |
| *G06F 13/28* | (2006.01) |

(52) U.S. Cl.
CPC ........ *G06F 13/1642* (2013.01); *G06F 9/4498* (2018.02); *G06F 12/0238* (2013.01); *G06F 13/1663* (2013.01); *G06F 13/1673* (2013.01); *G06F 13/287* (2013.01); *G11C 7/1048* (2013.01); *G06F 2212/7201* (2013.01)

(58) Field of Classification Search
CPC .............. G06F 13/1642; G06F 9/4498; G06F 12/0238; G06F 13/1663; G06F 13/1673; G06F 13/287; G06F 2212/7201; G11C 7/1048

USPC ......................................................... 711/154
See application file for complete search history.

(56) References Cited

U.S. PATENT DOCUMENTS

| | | | |
|---|---|---|---|
| 4,079,354 A | * 3/1978 | Nitta | ...................... G06F 13/37 710/107 |
| 6,065,077 A | 5/2000 | Fu | |

(Continued)

OTHER PUBLICATIONS

A+ Examcram 2: Memory; Types and Forms, Jan. 23, 2004, pp. 1-2 (Year:2004).

(Continued)

*Primary Examiner* — Christopher B Shin

(57) ABSTRACT

The systems and methods are configured to efficiently and effectively access memory. In one embodiment, a memory controller comprises a request queue, a buffer, a control component, and a data path system. The request queue receives memory access requests. The control component is configured to process information associated with access requests via a first narrow memory channel and a second narrow memory channel. The first narrow memory channel and the second narrow memory channel can have a portion of command/control communication lines and address communication lines that are included in and shared between the first narrow memory channel and the second narrow memory channel. The data path system can include a first data module and one set of unshared data lines associated with the first memory channel and a second data module and another set of unshared data lines associated with second memory channel.

17 Claims, 18 Drawing Sheets

(56) References Cited

U.S. PATENT DOCUMENTS

| | | |
|---|---|---|
| 6,420,754 B2 | 7/2002 | Takahashi et al. |
| 6,545,935 B1 | 4/2003 | Hsu et al. |
| 7,263,148 B2 | 8/2007 | Chang et al. |
| 7,526,602 B2 | 4/2009 | Kuwabara |
| 8,090,897 B2 | 1/2012 | Natarjan et al. |
| 8,200,883 B2 | 6/2012 | MacWilliams et al. |
| 8,253,751 B2 | 8/2012 | MacWilliams et al. |
| 8,255,618 B1* | 8/2012 | Borchers ............ G06F 13/1642 711/103 |
| 8,306,042 B1 | 11/2012 | Abts |
| 8,432,716 B2 | 4/2013 | Miura et al. |
| 8,866,830 B2 | 10/2014 | MacWilliams et al. |
| 9,251,863 B2* | 2/2016 | Kim ........................ G11C 5/063 |
| 9,658,953 B2 | 5/2017 | Sheffler |
| 9,846,550 B2 | 12/2017 | Muralimanohar et al. |
| 9,887,008 B2 | 2/2018 | Lee et al. |
| 10,236,051 B2 | 3/2019 | Ware et al. |
| 10,255,964 B2 | 4/2019 | Shin et al. |
| 10,446,200 B2 | 10/2019 | Hollis |
| 2004/0236894 A1* | 11/2004 | Grundy ............... G06F 13/1684 711/1 |
| 2005/0114587 A1* | 5/2005 | Chou .................... G06F 13/385 711/103 |
| 2006/0034307 A1 | 2/2006 | Uchida |
| 2006/0053255 A1 | 3/2006 | Sugizaki |
| 2010/0077267 A1* | 3/2010 | Perego ................. G06F 13/1694 714/716 |
| 2012/0117317 A1 | 5/2012 | Sheffler et al. |
| 2014/0040518 A1* | 2/2014 | Udipi .................. G06F 13/1605 710/117 |
| 2014/0164677 A1* | 6/2014 | Borchers ............. G06F 12/0246 711/103 |
| 2016/0071608 A1 | 3/2016 | Bronner et al. |
| 2016/0117240 A1* | 4/2016 | Dinkjian ................ G06F 12/02 711/165 |
| 2016/0232112 A1 | 8/2016 | Lee et al. |
| 2017/0285941 A1 | 10/2017 | Nale et al. |
| 2017/0285992 A1 | 10/2017 | Vogt |
| 2018/0090185 A1* | 3/2018 | Hossain .................... G11C 8/18 |
| 2019/0079676 A1* | 3/2019 | Seo ..................... G06F 13/4234 |
| 2019/0095361 A1* | 3/2019 | Morris ................. G06F 13/1689 |
| 2019/0121560 A1 | 4/2019 | Keeth et al. |
| 2019/0138493 A1 | 5/2019 | Teh |
| 2019/0180805 A1 | 6/2019 | Ware et al. |
| 2019/0188162 A1 | 6/2019 | Kwon et al. |
| 2019/0205268 A1 | 7/2019 | Hampel et al. |
| 2019/0361325 A1* | 11/2019 | Pertierra .................. G02B 5/20 |
| 2020/0133903 A1 | 4/2020 | Chen |
| 2022/0035760 A1 | 2/2022 | Lin |

OTHER PUBLICATIONS www.wikepedia.com, Static Random-Access Memory, Feb. 2017, pp. 1-5 (Year: 2017).

* cited by examiner

1600

1610 Receiving memory access requests that are directed to a plurality of memory components.

1620 Managing accesses to respective memory components including developing memory access directions comprising instructions for accesses via a plurality of channels, wherein a portion of the control lines and the address lines are included in and shared between a first channel and a second channel.

1630 Forwarding memory access information to the respective memory components.

FIG. 16

NARROW DRAM CHANNEL SYSTEMS AND METHODS

BACKGROUND OF THE INVENTION

Numerous electronic technologies such as digital computers, calculators, audio devices, video equipment, and telephone systems facilitate increased productivity and cost reduction in analyzing and communicating data and information in most areas of business, science, education, and entertainment. Electronic components can be used in a number of important applications (e.g., medical procedures, vehicle aided operation, financial applications, etc.) and frequently these activities involve storing large amounts of information. Storing and retrieving the information can have significant impacts on system performance. Traditional memory storage approaches can consume significant amount of resources and time.

The efficiency and effectiveness of memory storage operations can depend upon an application and the type of memory being utilized. The smallest access granularity for a Dynamic Random Access Memory (DRAM) channel is usually one cache line. In many DRAM systems the cache line access granularity is 64 Bytes. Memory chips are often coupled to or configured on support/mounting structures (e.g., memory cards, printed circuit boards, memory modules, memory sticks, etc.) and memory system standards such as a Joint Electron Device Engineering Council (JEDEC) standard also often indicate or require particular memory channel interface widths (e.g., 32 bits, 64 bits, 128 bits, etc.). This can result in various inefficiencies. Some applications (e.g., graph, etc.) that typically utilize smaller sized data usually result in access requests directed to the smaller sized data. This often results in various inefficiencies in conventional memory systems (e.g.: SDRAM systems, DDR systems, etc.). In addition, some applications involve memory accesses that can result in poor locality characteristics. For example, conventional graph processing applications are often limited to a very small portion or percentage of bytes in a cache line access actually being utilized and typically have poor data locality characteristics. The resources associated with accessing unused data are basically wasted.

SUMMARY OF THE INVENTION

The systems and methods are configured to efficiently and effectively access memory. In one embodiment, a memory controller comprises a request queue, a buffer, a control component, and a data path system. In one exemplary implementation, the memory controller can be a customizable memory controller. The request queue is configured to receive memory access requests. The buffer is configured to buffer data associated with the access requests. The control component is configured to process the access requests, wherein commands, addresses, and data associated with access requests are configured based upon communications between the control component and a first narrow memory channel and a second narrow memory channel. The first narrow memory channel and the second narrow memory channel can comprise communication lines including data communication lines, command/control communication lines, and address communication lines. A portion of the command/control communication lines and the address communication lines can be included in and shared between the first narrow memory channel and the second narrow memory channel. The data path system is configured to process data associated with the plurality of access requests. The data path system can include a first data module associated with the first narrow memory channel and a second data module associated with second narrow memory channel.

In one embodiment, the control processing component comprises a first finite state machine associated with the first narrow memory channel, and a second finite state machine associated with the second narrow memory channel. The data path system can comprise a first data module associated with the first narrow memory channel, and a second data module associated with the second narrow memory channel. The directions for memory accesses directed respectively to the first narrow memory channel and the second narrow memory channel can be multiplexed on the shared portion of the control lines. In one exemplary implementation, a write with auto-precharge (WRA) or read with auto precharge (RDA) is used instead of a respective write command (WR) and read command (RD) to provide balanced command/data bus utilization. The memory controller can communicate with the first narrow memory channel and the second narrow memory channel in accordance with a close page policy. The control processing component can include a signal generator to generate command signals. The memory controller can use a read/write with auto-precharge command to preserve a slot on the command bus for use by another access command. The memory controller can control the first narrow channel and the second narrow memory channel independently and concurrently.

In one embodiment, a configurable memory control method comprises receiving memory access requests, managing accesses to respective memory components, and forwarding memory access information to the respective memory components, including the memory access directions. The memory access requests can be are directed to a plurality of memory components. Managing accesses to the respective memory components includes developing memory access directions. The memory access directions can include instructions for access via a plurality of memory channels comprising a first narrow memory channel and a second narrow memory channel. The first narrow memory channel and the second narrow memory channel comprise communication lines, wherein the communication lines include data lines, control lines, and address lines. A portion of the control lines and the address lines are included in and shared between the first narrow memory channel and the second narrow memory channel. Managing accesses can include initiating an auto-precharge. Managing accesses can include preserving a slot on a command line and balancing command/data bus utilization. In one exemplary implementation, the configurable memory control method further comprises sharing a command link for plurality of separate dedicated data links.

In one embodiment a memory system comprises a first narrow memory channel, a second narrow memory channel, and a first memory controller. The first narrow memory channel is configured to communicate with a first portion of memory. The first narrow memory channel can be associated with a first unshared portion of communication lines and a first shared portion of communication lines. The second narrow memory channel is configured to communicate with a second portion of memory. The second narrow memory channel is associated with a second unshared portion of communication lines and the first shared portion of communication lines. The first shared portion of communication lines is shared by the first narrow memory channel and the second narrow memory channel. The first memory controller is configured to direct communication with the first portion of memory via the first narrow memory channel and direct communication with the second portion of memory via the second narrow memory channel. The first narrow memory channel can be associated with a first unshared set of data communication lines, a first unshared set of command/control lines, and a set of shared command/control lines and a set of shared address lines. The second narrow memory channel can be associated with a second unshared set of data communication lines, a second unshared set of command/control lines, and the shared command/control lines and the set of shared address lines. In one exemplary implementation, the first unshared set of command/control lines can include a first chip select and the second unshared set of command/control lines can include a second chip select.

In one embodiment, a memory system further comprises a third narrow memory channel, a fourth narrow memory channel, and a second memory controller. The third narrow memory channel is configured to communicate with a third portion of memory. The third narrow memory channel is associated with a third unshared portion of communication lines and a second shared portion of communication lines. The fourth narrow memory channel is configured to communicate with a fourth portion of memory. The fourth narrow memory channel can be associated with a fourth unshared portion of communication lines and the second shared portion of communication lines. The second memory controller is configured to direct communication with the third portion of memory via the third narrow memory channel and direct communication with the fourth portion of memory via the fourth narrow memory channel. The first memory controller and the second memory controller can be included in a system memory controller, wherein the system memory controller. The system memory controller can include a memory management unit configured to translate between virtual memory addresses and physical memory addresses. The system memory controller can include a MUX/DeMUX configured to coordinate communications to and from the memory management unit.

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIG. 16 is a flow chart of memory channel method in accordance with one embodiment.

DETAILED DESCRIPTION OF THE INVENTION

Figure 1:
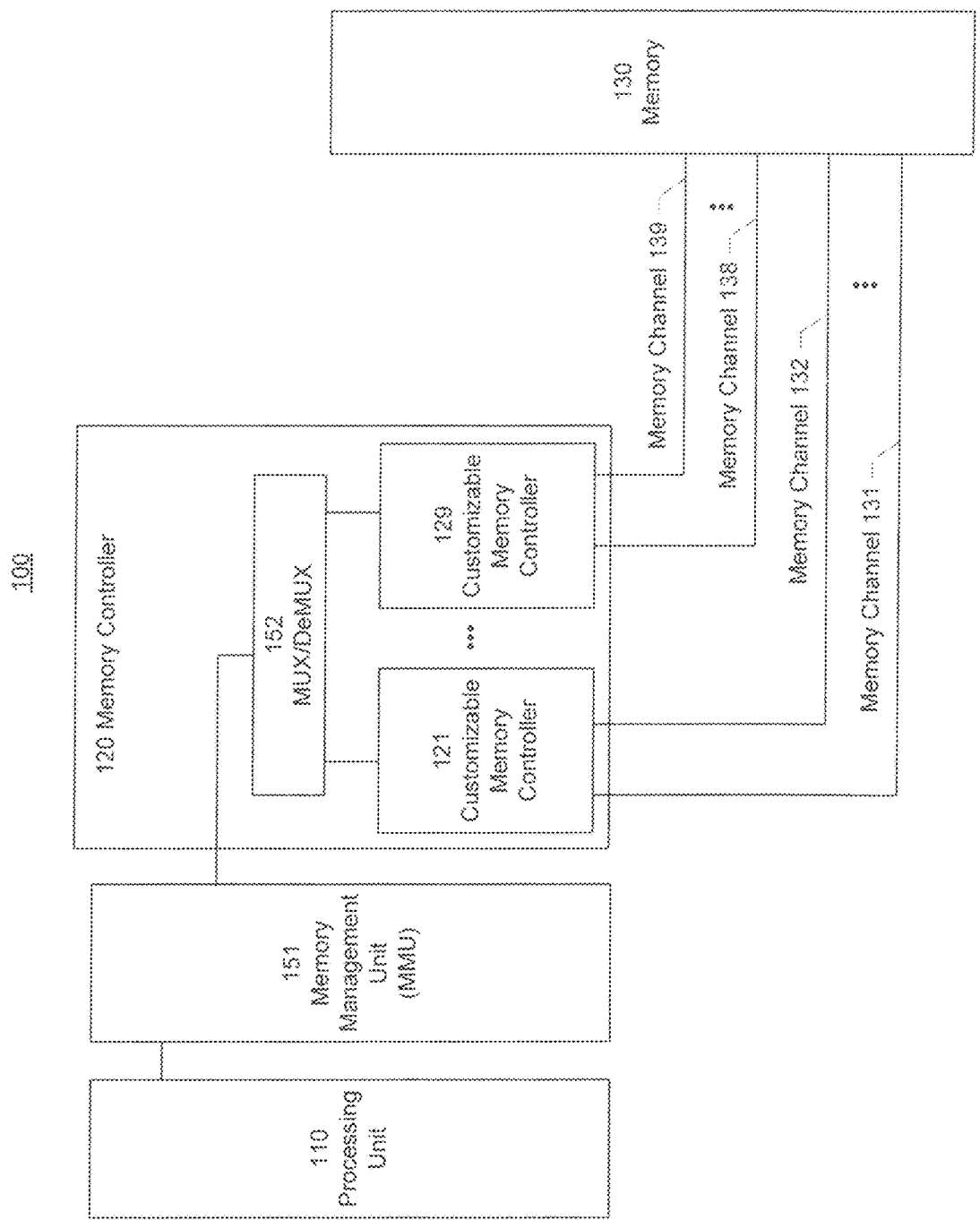
FIG. 1 is a block diagram of an exemplary memory system in accordance with one embodiment.

Reference will now be made in detail to the embodiments of the present technology, examples of which are illustrated in the accompanying drawings. While the present technology will be described in conjunction with these embodiments, it will be understood that they are not intended to limit the technology to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or an intervening element may be present. In contrast, when an element is referred to as being "directly connected" to another element, there are not intervening elements present. It is also to be understood that the phraseology and terminology used herein is for the purpose of description and should not be regarded as limiting.

The systems and methods facilitate efficient and effective of memory controllers and associated memory channels. In one embodiment, systems and methods enable customization of memory controllers and memory channel characteristics while maintaining compatibility with standards and protocols. In one embodiment, a DRAM customizable/configurable memory controller is compatible with commodity DRAM standards and Double Data Rate (DDR) protocols. In one exemplary implementation, a DRAM customizable/configurable memory controller does not require modification on a DRAM chip. The customization of the memory controllers and memory channels can be directed to enabling random access with smaller access granularity than is available with traditional commercial memory systems. The systems and methods can help efficient and effective utilization of DRAM resources for applications and data with poor locality characteristics. In addition, overall address pin overhead can be reduced by portions of memory communication buses that are shared by multiple memory channels.

In one embodiment, a customizable memory controller enables customization of memory channel data widths while maintaining compatibility with standards and protocols. In one exemplary implementation, the memory controller directs utilization of non-standard data memory channel widths while maintaining compatibility with standard memory configurations and communication/access protocols. In one embodiment, a plurality of memory channels have separate data lines and shared command or control lines and shared address lines. A portion or some of the command/control lines in a memory channel are shared by multiple memory channels and a portion or some command/control lines are assigned to a single memory channel (e.g., some command lines are not shared between multiple memory channels, etc.). In one embodiment, command/control signals and corresponding lines are multiplexed between multiple memory channels.

FIG. 1 is a block diagram of memory system 100 in accordance with one embodiment. Memory system 100 includes processing unit 110, memory management unit (MMU) 151, system memory controller 120, and memory 130. System memory controller 120 includes MUX/DeMUX 152 and memory controllers 121 through 129. Processing unit 110 is coupled to system memory controller 120 (e.g., via MMU 110, etc.). Memory management unit 110 is coupled MUX/DeMUX 152 which selectively couples to one or multiple memory controllers 121 through 129 which are coupled to memory 130. In one embodiment, the memory controller is a customizable memory controller. If there is a single memory controller, the memory management unit can couple to the single memory controller without a MUX/DeMUX in the path. Memory 130 stores information associated with memory access requests. Memory management unit 110 is configured to manage the memory access requests including translation of virtual and physical memory address indications. Memory controllers 121 through 129 control communications between memory management unit 110 and memory 130. In one embodiment, memory controllers 121 through 129 control communications communicated via a plurality of memory channels coupled to memory 130. In one exemplary implementation, memory controller 121 controls communications via a set of memory channels (e.g., memory channels 131, 132, etc.) and memory controller 129 controls communications via a different set of memory channels (e.g., memory channels 138, 139, etc.). Memory controller 120 enables customization of data memory channel widths while maintaining compatibility with standards and protocols. In one embodiment, the memory controllers 121 through 129 direct utilization of non-standard data memory channel widths while maintaining compatibility with standards for memory configurations and memory communication/access protocols.

In one embodiment, the memory channel width configuration is selectively customizable. In one exemplary implementation, a memory channel width configuration is narrower than a traditional commercial memory channel width. In one exemplary implementation, a memory channel width configuration is narrower than a memory channel width defined in a standard. The memory channel can be smaller or narrower than a JEDEC defined memory channel. The narrower width memory channel can remain compatible with JEDEC standard width interface requirements. In one exemplary implementation, the data width of the memory channel is 8 bits wide and the data width of the memory card/module interface is 64 bits wide. In one embodiment, a narrower memory channel width of 8 data bits with a burst of 8 provides an access granularity of 8 bytes.

Figure 2:
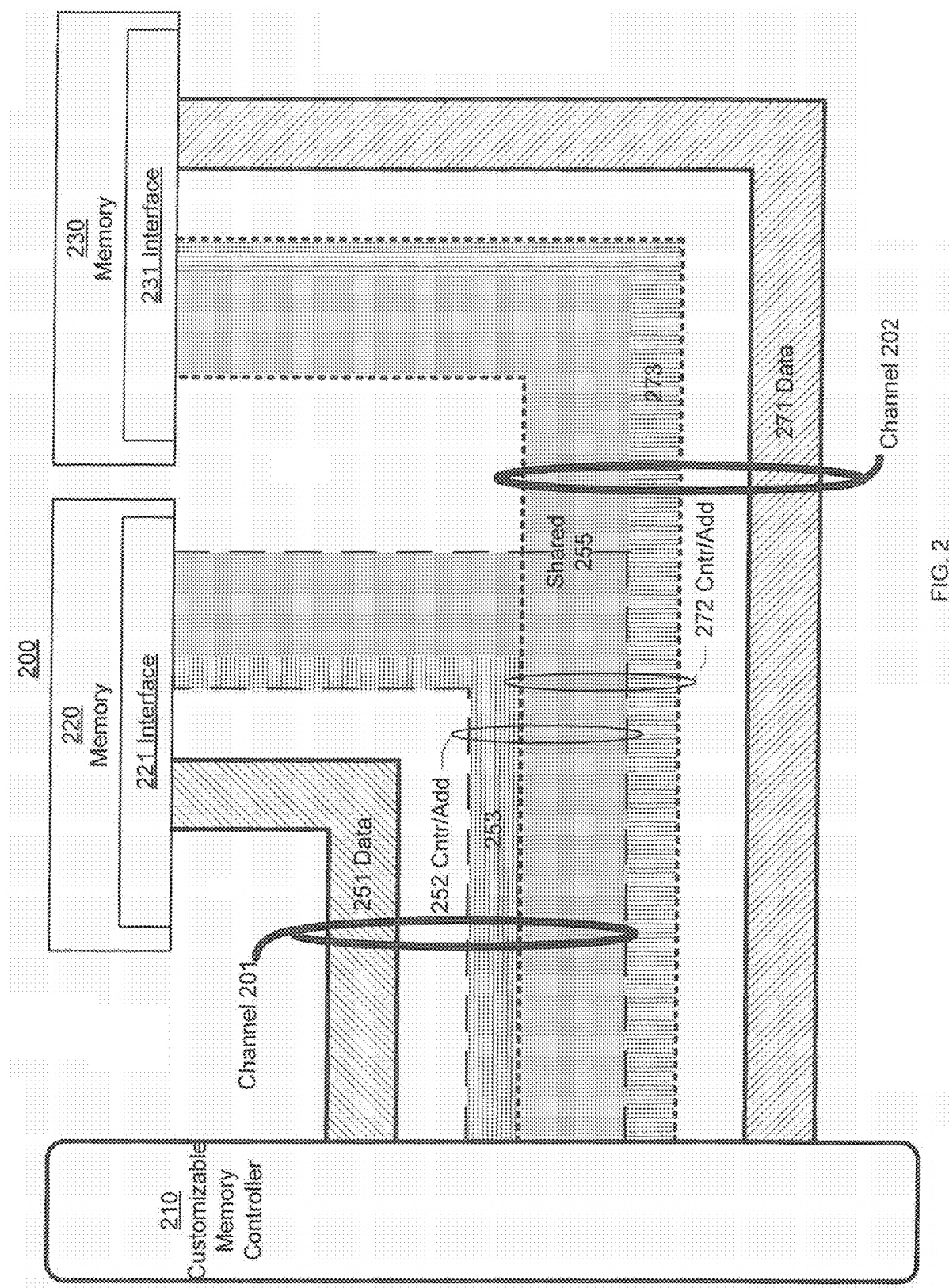
FIG. 2 is a block diagram of an exemplary memory system 200 in accordance with one embodiment of a memory channel configuration.

FIG. 2 is a block diagram of memory system 200 in accordance with one embodiment. Memory system 200 includes memory controller 210, memory 220, and memory 230. It is appreciated memories 220 and 230 can comprise various configurations (e.g., various configurations of chips, arrays, banks, ranks, etc.) and types of memory (e.g., DRAM, SDRAM, DDR, flash, etc.). In one embodiment, memory 220 and 230 include memory chips configured on a memory card/module. In one exemplary implementation, memory 220 and 230 are included on respective separate/distinct memory cards/modules. Memory controller 210 communicates with memory 220 via memory channel 201 and memory channel 202.

Memory channel 201 includes data bus 251 and command/address bus 252. In one embodiment, command bus 252 includes a portion of command lines or signals 253 that are dedicated to memory channel 201 and a portion of command lines or signals 255 that are shared with memory channel 202. Memory channel 202 includes data bus 271 and command/address bus 272. In one embodiment, command bus 272 includes a portion of command lines or signals 273 that are dedicated to memory channel 202 and a portion of command lines or signals 275 that are shared with memory channel 201. In one exemplary implementation, a portion of shared command/control communication lines or signals include a clock signal, a clock enable (CE) signal, a data mask (DQM) signal, a write enable (WE) signal, a row access strobe (RAS) signal, column access strobe (CAS) signal, address signals (e.g., bank address (BA), row/word address, column/bit address, etc.), and an activate command (ACT) signal. A portion of unshared command/control communication lines or signals can include a chip select (CS) signal.

In one embodiment, a memory channel is a group of signals associated with a memory access. In one exemplary implementation, a memory channel includes the data signals, command/control signals, and memory address signals associated with a memory access. A memory channel can be associated with or include communication lines and a memory card/module interface (e.g., pins in a slot/connector for removably coupling with a memory card/module, etc.). A memory channel can be associated with or include portions of a customizable memory controller. A memory channel can be associated with or include portions of memory card/module and memory chips.

The memory channel widths and memory card/module interface widths can vary. In one exemplary implementation, a first data bus width of memory channels 201 and 202 is 8 bits respectively and corresponding data width portions of memory interfaces 221 and 231 associated with memory channels 201 and 202 are 8 bits wide respectively. It is appreciated that a data width of memory interface 221 and 231 for the overall memory card/modules 220 and 230 can be larger (e.g., 64 bits, 72 bits, etc.) than 8 bits wide. A memory interface for a memory card/module can service more than one memory channel. In one exemplary implementation, a first data bus width of memory channels 201 and 202 is 8 bits respectively and a second data width of memory interfaces 221 and 231 is 64 bits respectively. In one embodiment, a first data bus width of memory channel 201 can be 8 bits and a second data width of memory interface 221 can be 64 bits and a first data bus width of memory channel 202 can be 9 bits and a second data width of memory interface 231 can be 72 bits. In one embodiment, a first data bus width of memory channel 201 can be 8 bits and a second data width of memory interface 221 can be 64 bits and a first data bus width of memory channel 202 can be 16 bits and a second data width of memory interface 231 can be 128 bits.

A memory controller can include a dedicated data queue, arbiter, and data path for respective one of the plurality of narrow memory channels, and a shared request queue and signal generator scheduler. The shared request queue can have a memory channel address added. The added memory channel address can be one bit with a logical 0 indicating a first memory channel and a logical 1 indicating a second memory channel. In one embodiment, a memory controller can control a plurality of memory channels independently and concurrently.

Figure 3:
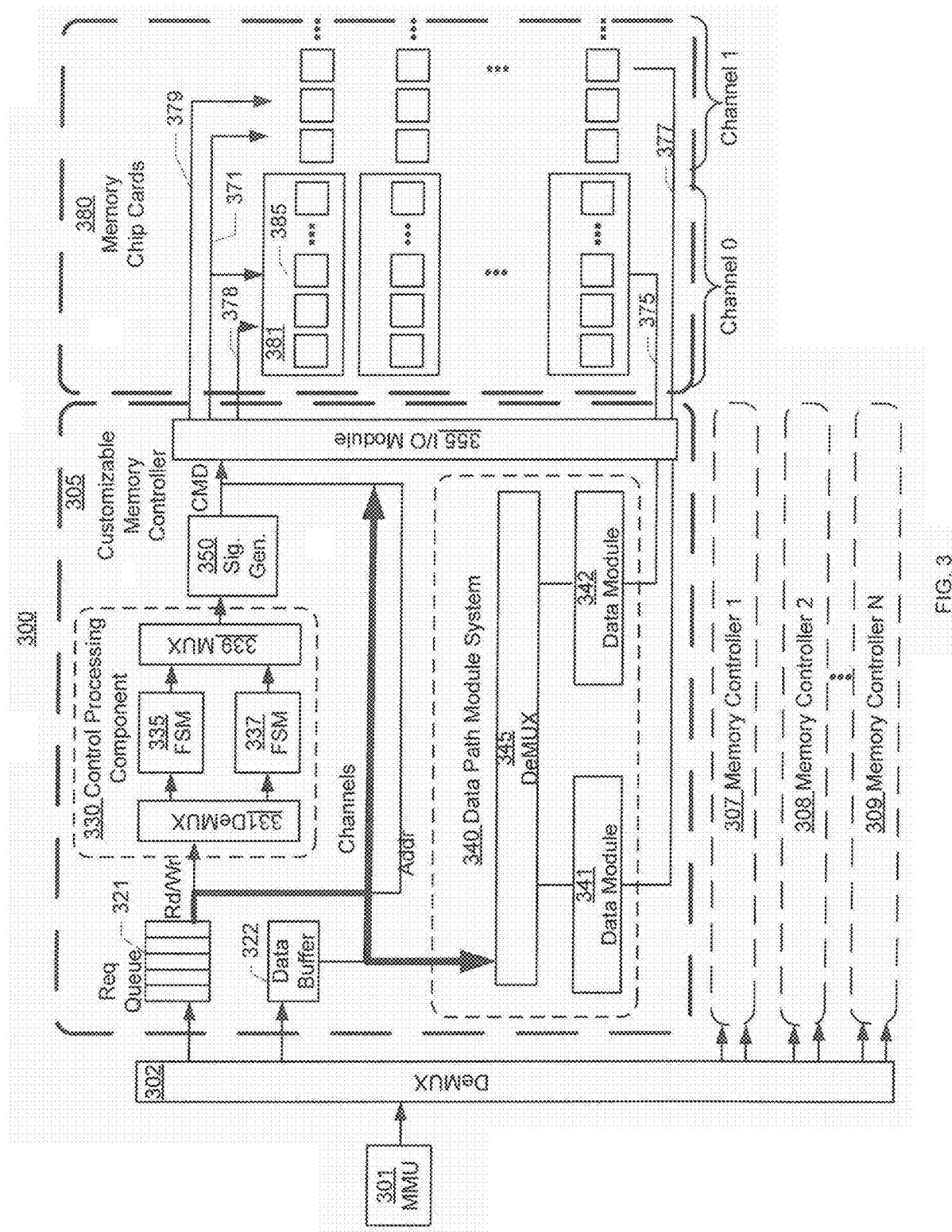
FIG. 3 is a block diagram of an exemplary memory system in accordance with one embodiment of a memory controller.

FIG. 3 is a block diagram of exemplary memory system 300 in accordance with one embodiment. Memory system 300 includes MMU 101, DeMUX 102, memory controllers 305, 307, 308, and 309 and memory cards/modules 380. MMU 101 is coupled to DeMUX 302 which is coupled to memory controllers 305, 307, 308, and 309. Memory controller 305 is coupled to memory cards/modules 380. In one exemplary implementation, components of memory system 300 are similar to memory system 100, including MMU 301 is similar to MMU 110, memory controller 305 is similar to memory controller 121, and memory cards/modules 380 is similar to memory cards/modules 130. The memory controller 305 can include a request queue 321, a data buffer 322, control processing component 330, data path module system 340, signal generator 340, and I/O Module 355. Request queue 321 is coupled to control processing component 330 and data path module system 340 which is coupled to and data buffer 322 and input/output (I/O) Module 355. Control processing component 330 is coupled to signal generator 340 which is coupled to I/O Module 355. Control processing component 330 includes a command demultiplexer 331 coupled to a plurality of finite state machines 335 and 337, which are coupled to command multiplexer 339. Data path module system 340 includes a data demultiplexer 345 coupled to a plurality of data modules 341 and 342. In one embodiment, a memory controller can be considered a narrow channel (NC) memory controller.

The memory controller 305 can be coupled to a plurality of narrow channel (NC) memory cards/modules. A memory card/module 381 can include a plurality of memory chips (e.g., 385, etc.). In one exemplary implementation, the memory cards/modules 380 can be dynamic random-access memory (DRAM) Dual In-line Memory Module DIMMs (e.g., printed circuit boards). The memory chips can be dynamic random-access memory (DRAM) integrated circuits (IC) chips compliant with a commodity memory chip standard such as Joint Electron Device Engineering Council (JEDEC). It is appreciated the memory chips can be compatible with other standards. The memory chips 382 can have data pins for transferring a specified number of bits of data. For example, the memory chips 382 can have data pins for input and output of 2, 4, 8, or 16 bits of data. The memory chips 382 can be organized into ranks to provide a predetermined number of bytes of data, such as 2 memory chips per rank each chip having data pins for access to 4 bits each, or 1 memory chip per rank each chip having data pins for access to 8 bits each. In one embodiment, the term narrow memory channel (NC) comprises a predetermined fraction of standard commercial memory channel, and a multiple (e.g., 1×, 2× . . . ) of the bit width of the component memory integrated circuit (IC) chips. The width of a narrow memory channel (NC) can be equal to a bit width of a rank of dynamic-random access memory (DRAM), wherein a rank is a set of IC chips that share the same chip select signal.

In one exemplary implementation, the memory controller 305 can communicate with each memory channel with a close page policy. Memory controller 305 can control two individual memory channels at the same time utilizing unshared dedicated data buses 375 and 377, unshared dedicated chip select lines 378 and 378, and a shared common command bus 371. In one implementation, the memory controller can utilize auto pre-charge write and read command (WRA/RDA), instead of standard write and read commands (WR/RD). The auto pre-charge write and read commands can be configured to preserve a slot on the command bus and therefore provide balanced command bus and data bus utilization.

In one embodiment, the memory controller 305 with relatively small access granularity can advantageously improve data utilization and improve data bus throughput for a given data bus bandwidth for poor data locality applications such as graph processing. The close page policy can provide improved random-access to data for use in applications such as graph processing. The memory controller 305 can also advantageously work with readily available commodity memories, such as dynamic random-access memory (DRAM).

Request queue 321 is configured to receive access requests in a first width memory channel configuration. The request queue can have an added one bit memory channel address. Data buffer 322 is configured to buffer data associated with the access requests. Control processing component 330 is configured to process commands associated with the access requests. The commands associated with access requests are configured for utilization with a plurality of second width memory channels that are individually narrower than the first width memory channel configuration. Data path module system 340 is configured to process data associated with the plurality of access requests, wherein data is output in configuration is compatible with the plurality of second width memory channels. The plurality of finite state machines (e.g., 335 and 337) are associated with respective ones of the plurality of second width memory channels. The respective ones of the plurality of data modules (e.g., 341 and 342) are associated with respective ones of the plurality of second width memory channels. The plurality of second width memory channels have respective unshared dedicated data bus (e.g., 375 and 377, etc.), unshared dedicated chip selects (e.g., 378, 279, etc.) and shared command bus (e.g., 371, etc.). Signal generator 340 generates command signals for both memory channels via the shared command bus.

In one embodiment, shared command/control links and address links are the same for a memory access and unshared data links in the respective narrow memory channels are the same data width. In one exemplary implementation, shared command/control links and address links are the same for a memory access in both a first data width memory access configuration and a narrower second data width memory access configuration. The command link can be shared between two memory channels in the narrower second width memory access configuration while data links are unshared/dedicated.

In one embodiment, a memory channel includes command/control lines and address lines that are shared with another memory channel and unshared data lines and unshared command/control lines (e.g., chip select lines, etc.) that are not shared with another memory channel. In one embodiment, a memory channel includes command lines and address lines that are shared with another memory channel and data lines and rank select lines that are not shared with another memory channel. The memory chip card/module can be a SDRAM DIMM configuration that has more than 8 ranks with corresponding extra rank select signals in the memory controller or host memory controller. In one exemplary implementation a memory channel can include a plurality of DRAM cards/modules. A memory channel with an 8 bit data width can have two x4 DRAM chips or one x8 DRAM chip.

Figure 4:
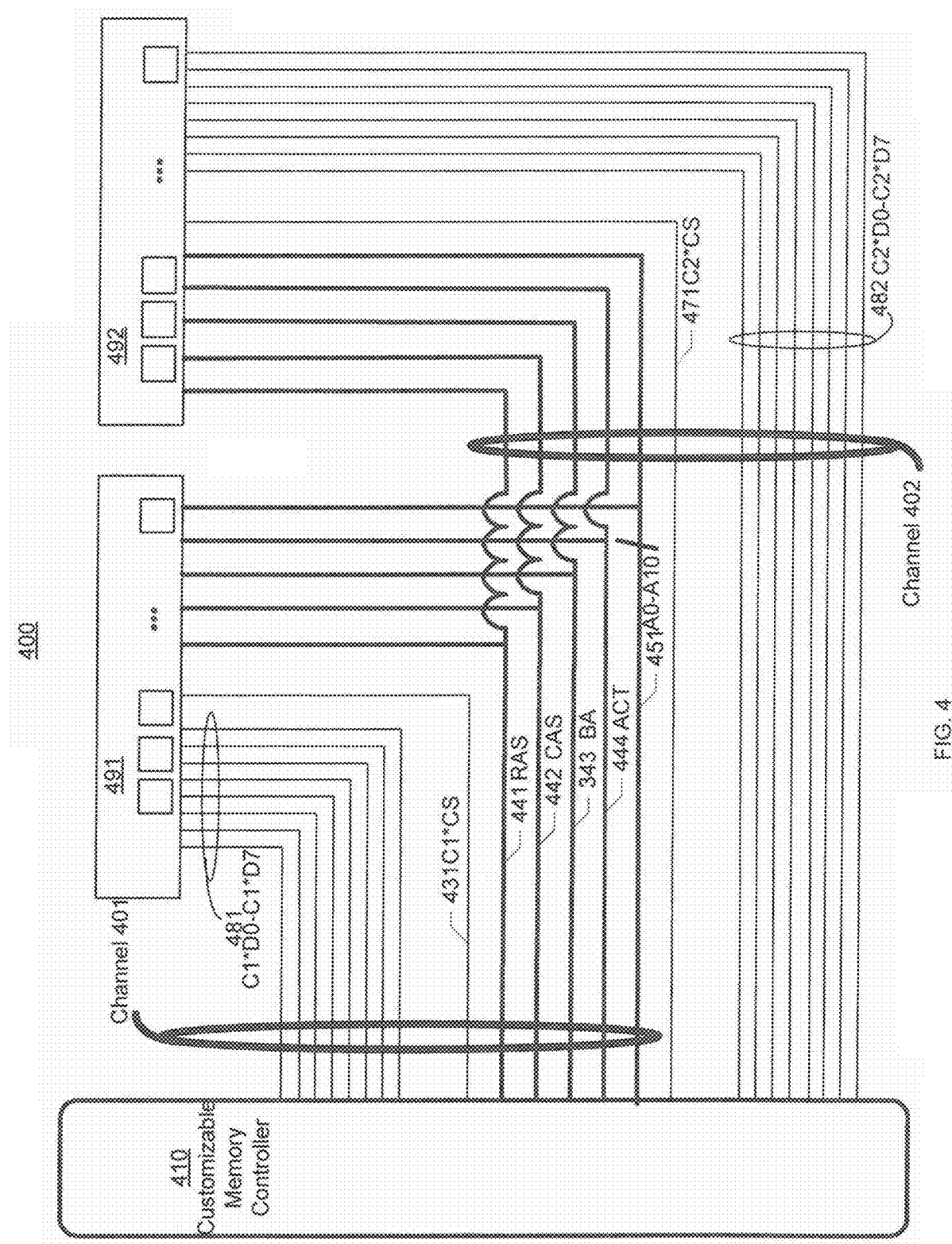
FIG. 4 is a block diagram of an exemplary memory system channel configuration in accordance with one embodiment.

FIG. 4 is a block diagram of a memory system 400 channel configuration in accordance with one embodiment. In one exemplary implementation, memory system 400 is similar to memory system 300. Memory system 400 includes memory controller 410 and memory chip cards/modules 490. Memory controller 410 is coupled to memory chip card/module 491 via memory channel 401. Memory controller 410 is coupled to memory chip card/module 492 via memory channel 402.

Memory channel 401 includes data bus 481 that is 8 bits wide (D0, D1, D2, . . . , D7) and comprises memory channel 1 data line 0 (C1*D0) through memory channel 1 data line 7 (C1*D7). Memory channel 402 includes data bus 482 that is 8 bits wide (D0, D1, D2, . . . , D7) and comprises memory channel 2 data line 0 (C2*D0) through memory channel 2 data line 7 (C2*D7). Memory channel 401 and memory channel 402 share command lines, including row access strobe (RAS) 441, column access strobe (CAS) 442, bank address (BA) 443, and activate command (ACT) 444. Memory channel 401 and memory channel 402 also share multiple address lines 451 that are 11 bits wide, including address line A0, address line A1, through . . . , address line A9, and address line A10. Memory channel 401 includes a separate chip select or rank select line (C1*CS) 431 that is not shared with memory channel 402. Memory channel 402 includes a separate chip select or rank select line (C2*CS) 471 that is not shared with memory channel 401.

Figure 5:
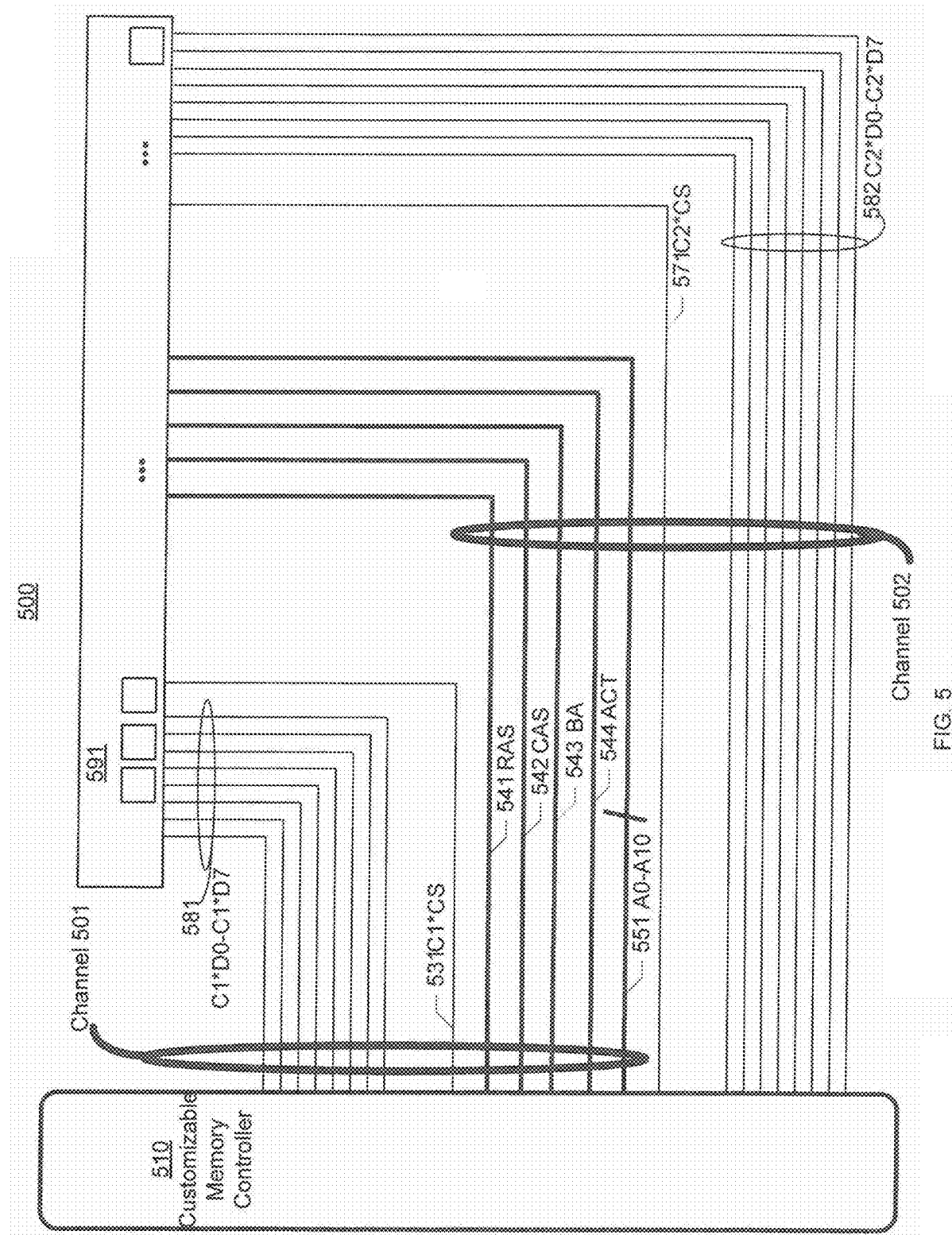
FIG. 5 is a block diagram of another exemplary memory system channel configuration in accordance with one embodiment.

In one embodiment, multiple memory channels can be coupled to a single memory card/module. FIG. 5 is a block diagram of a memory system 500 channel configuration in accordance with one embodiment. In one exemplary implementation, memory system 500 is similar to memory system 300. Memory system 500 includes memory controller 510 and memory chip card/module 591. Memory controller 510 is coupled to memory chip card/module 591 via channel 502 and channel 502.

Memory channel 501 includes data bus 581 that is 8 bits wide (D0, D1, D2, . . . , D7) and comprises memory channel 1 data line 0 (C1*D0) through memory channel 1 data line 7 (C1*D7). Memory channel 502 includes data bus 582 that is 8 bits wide (D0, D1, D2, . . . , D7) and comprises memory channel 2 data line 0 (C2*D0) through memory channel 2 data line 7 (C2*D7). Memory channel 501 and channel 502 share command lines, including row access strobe (RAS) 541, column access strobe (CAS) 542, bank address (BA) 543, activate command (ACT) 544. Memory channel 501 and memory channel 502 also share multiple address lines 551 that are 11 bits wide, including address line A0, address line A1, through . . . , address line A9, and address line A10. Memory channel 501 includes a separate chip select or rank select line (C1*CS) 531 that is not shared with memory channel 502. Memory channel 502 includes a separate chip select or rank select line (C2*CS) 571 that is not shared with channel 501.

Figure 6:
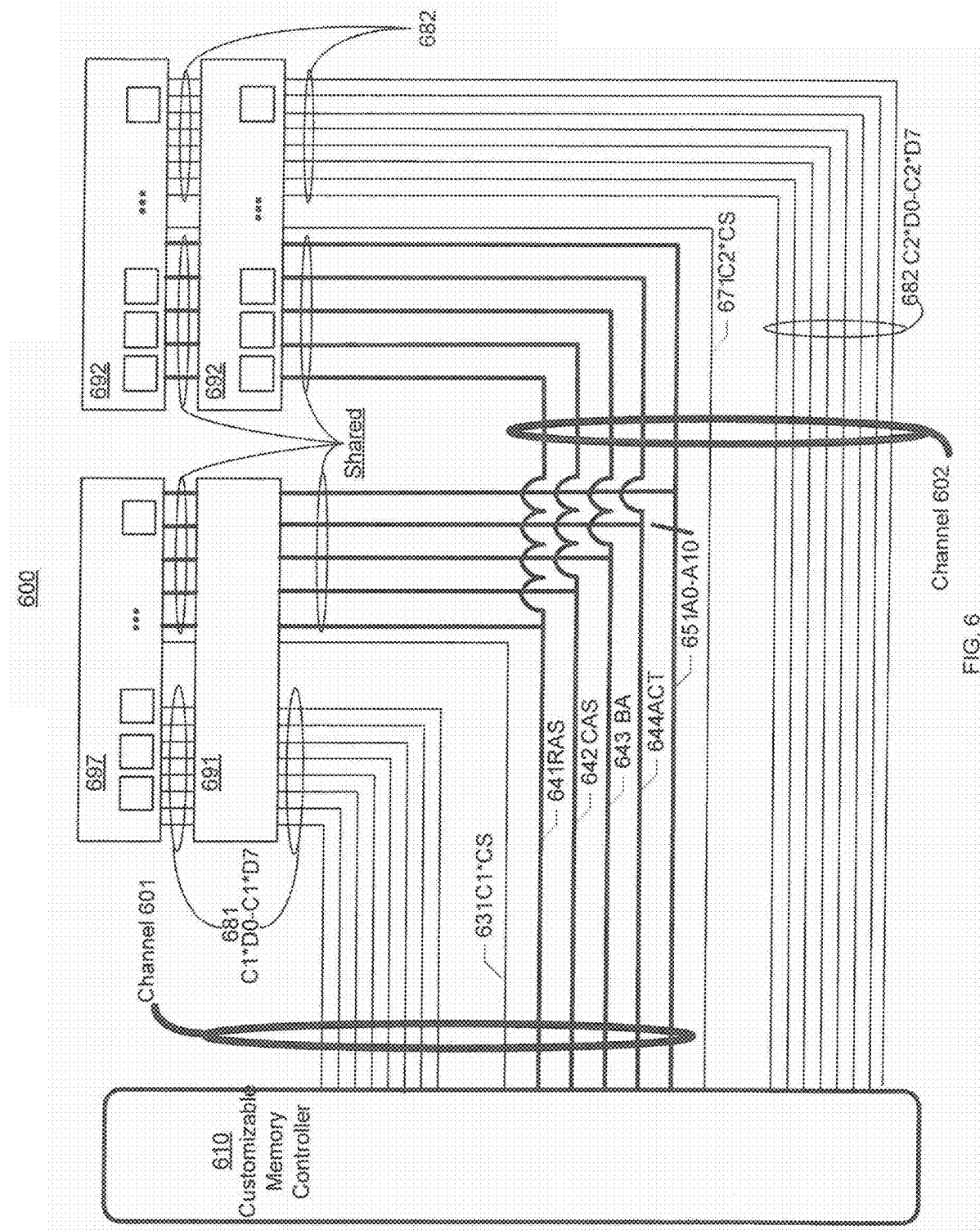
FIG. 6 is a block diagram of an exemplary memory system in accordance with one embodiment of multiple memory modules in a memory channel.

In one embodiment, a memory channel can be coupled to a multiple memory card/module. FIG. 6 is a block diagram of a memory system 600 channel configuration in accordance with one embodiment. In one exemplary implementation, memory system 600 is similar to memory system 300. Memory system 600 includes memory controller 610 and memory chip cards/modules 690. Memory controller 610 is coupled to memory chip card/module 691 via memory channel 601. Memory controller 610 is coupled to memory chip card/module 692 via memory channel 602.

Memory channel 601 includes data bus 681 that is 8 bits wide (D0, D1, D2, . . . , D7) and comprises memory channel 1 data line 0 (C1*D0) through memory channel 1 data line 7 (C1*D7). Memory channel 602 includes data bus 682 that is 8 bits wide (D0, D1, D2, . . . , D7) and comprises memory channel 2 data line 0 (C2*D0) through memory channel 2 data line 7 (C2*D7). Memory channel 601 and memory channel 602 share command lines, including row access strobe (RAS) 661, column access strobe (CAS) 662, bank address (BA) 663, activate command (ACT) 664. Memory channel 601 and memory channel 602 also share multiple address lines 651 that are 11 bits wide, including address line A0, address line A1, through . . . , address line A9, and address line A10. Memory channel 601 includes a separate chip select or rank select line (C1*CS) 631 that is not shared with memory channel 602. Memory channel 602 includes a separate chip select or rank select line (C2*CS) 671 that is not shared with memory channel 601.

In one embodiment, a conventional system uses multiple commands associated with a respective memory access. The multiple commands can include a dedicated pre-charge command, an activation command (ACT), and an address command (e.g., write with auto-precharge (WRA), read with auto-precharge (RDA), etc.). A command can be associated with a command cycle. In one embodiment, a command cycle is the amount of time from receiving a command plus the time delay to receiving the next command. In one exemplary implementation, the time period or number of clock cycles per command cycle can vary for different commands. An ACT command cycle and corresponding time delay between the row and column commands (tRCD) can take 16 clock cycles. A WR command cycle and corresponding time delay between two column commands (tCCD) can take 8 clock cycles.

It is appreciated there can be a varying number of command cycles and data cycles associated with a respective access. In conventional systems there are 3 command cycles associated and 4 data cycles associated with and access. In one embodiment, an access is associated with an ACT command cycle, a WR command cycle, and a WRA command cycle, and the access is also associated with a corresponding four data cycles (e.g., a 64 bit data burst, 8 bits of data in 4 data cycles, etc.).

Rather than actually sending a pre-charge command from the controller on a separate memory channel communication line, the pre-charge command can be derived from other commands. In one exemplary implementation, a dedicated or controller specific pre-charge command can be derived from an ACT-WR-WRA command sequence. A dedicated pre-charge command can be issued in association with a particular access operation (e.g., read, write, etc.). In one exemplary implementation, a dedicated pre-charge command is issued by the controller multiple times for respective accesses as opposed to an auto pre-charge command that is issued once to automatically cover multiple accesses without the controller having to issue multiple pre-charge commands.

Figure 7:
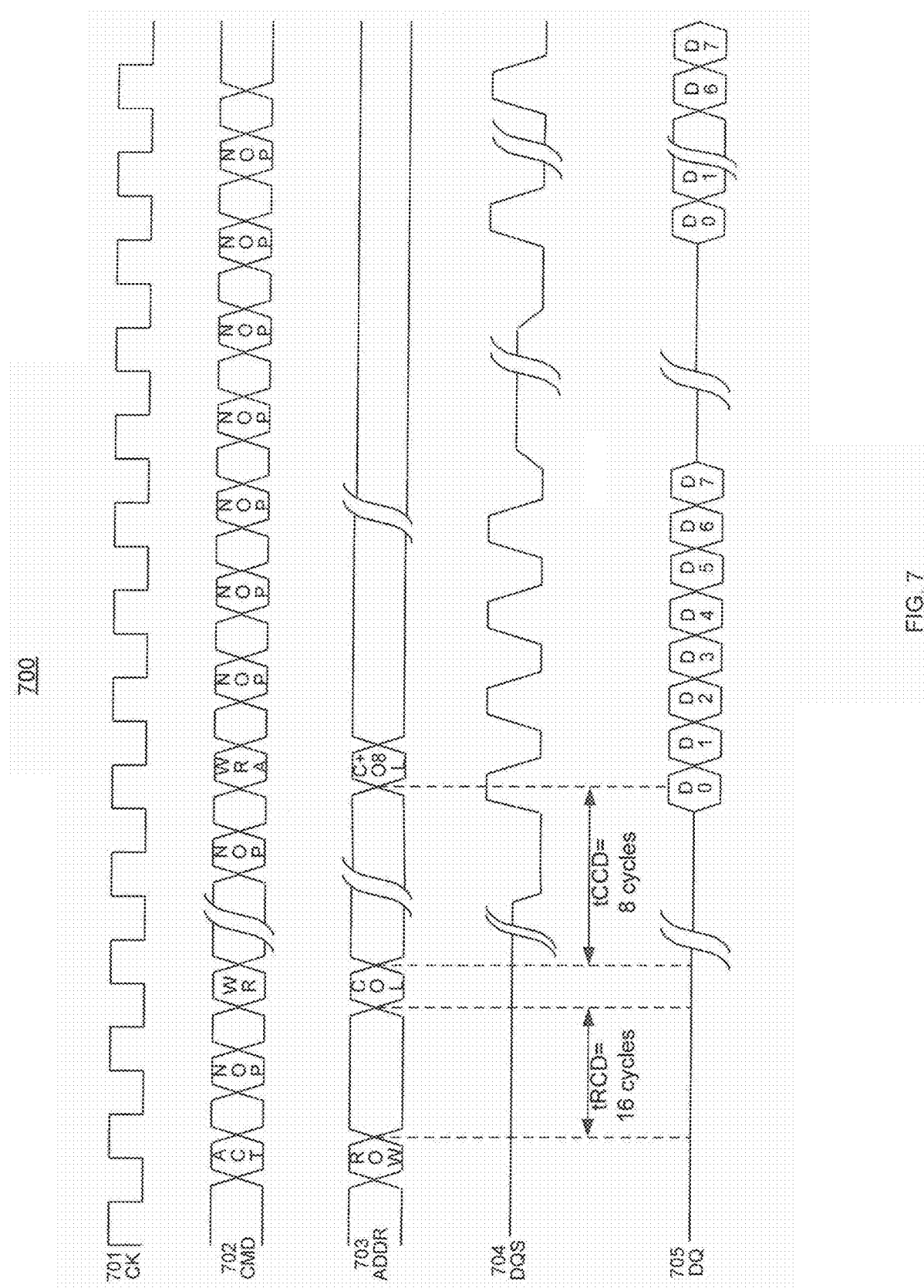
FIG. 7 is a block diagram of an exemplary timing diagram in accordance with an embodiment.

FIG. 7 is a block diagram of an exemplary timing diagram 700 in accordance with an embodiment. Timing diagram 700 includes clock timing 701, command timing 702 address timing 703, data strobe 704, and data 705. In one exemplary implementation, timing diagram 700 is associated with dedicated or controller specific pre-charge command. As illustrated, there are two time periods 751 and 752 associated with the dedicated pre-charge operations (e.g., time to receive the command plus delay to the next command, etc.). In one embodiment, time delay between the row and column commands (tRCD) is 16 clock cycles and time delay between two column commands (tCCD) is 8 clock cycles.

In one embodiment, a memory controller uses an auto-precharge command to "preserve" or "save" a time slot on the command bus (e.g., not use a time slot for a dedicated pre-charge sequence, etc.). In a conventional approach three controls/command are used for accessing memory such as dedicated precharge, activate, and WR/RD. In one embodiment, a close page policy and auto-pre-charge are implemented eliminated the need for a dedicated precharge command/control, allowing write accesses to be implemented with two commands (such as ACT and a WRA) read access to be implemented with two commands (such as ACT and a RDA). Automatically closing the page and using auto-pre-charge provides an opportunity to save time conventional systems expended performing a dedicated precharge command/control. In one exemplary implementation, the time slot between the column commands (WRA) and next row command (ACT) are preserved or saved. In one embodiment, the "preserved" or "save" can be used for another command or operation.

In one embodiment, when an auto pre-charge is being used, two commands (e.g., ACT and WRA, ACT and RDA, etc.) are used for respective accesses. In one exemplary implementation, there are two command cycles for four data cycles. This means utilization of the command bus is 50% per access and there is time on the command bus for an additional access. In one embodiment, a command bus is shared between a first memory channel and a second memory channel, command operations associated with a first access can be implemented on the first memory channel for the first 50% of the time and command operations associated with a second access can be implemented on the second memory channel for the second 50% of the time.

Data rates per clock cycle can also vary. In one exemplary implementation, a double data rate (DDR) includes two data cycles per a clock cycle. In one embodiment, in DDR4 there are relatively long waits when issuing a memory request. In one exemplary implementation, when implementing an auto pre-charge scheme there are two basic commands (e.g., ACT, WRA/RDA, etc.) versus 4 data cycles. This can result in 2 idle cycles in traditional systems and methods. In a memory controller system and method (e.g.: 100, 300, etc.) the otherwise two idle cycles can be utilized to access memory via another memory channel sharing the command and address lines. In one embodiment, sharing the command and address lines helps avoid too many control pins after narrowing he data memory channel.

Figure 8:
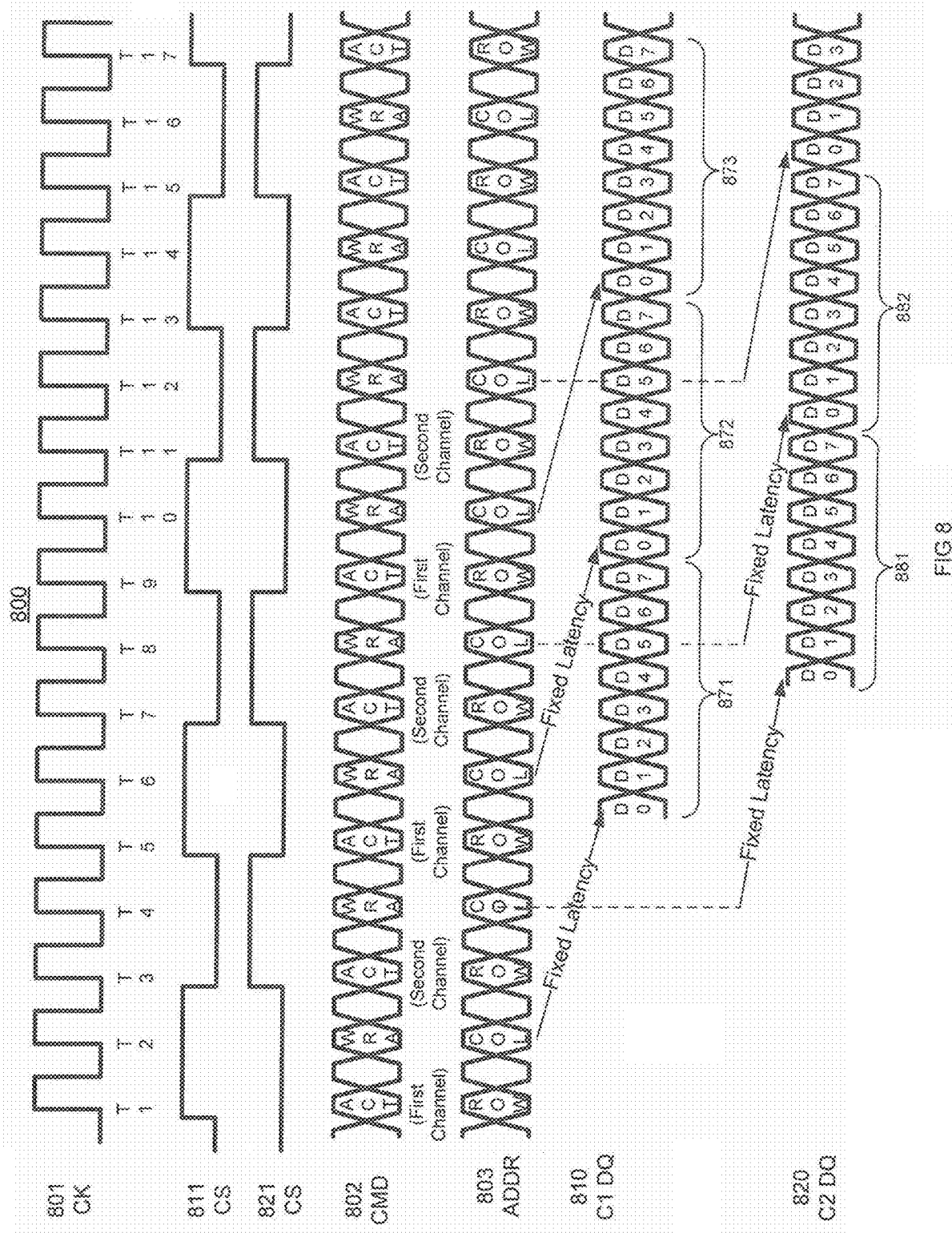
FIG. 8 is a block diagram of another exemplary timing diagram in accordance with an embodiment.

FIG. 8 is a block diagram of an exemplary timing diagram 800 in accordance with an embodiment. In one exemplary implementation, timing diagram 800 is associated with instructions from a memory controller in which a portion of the command and address lines are shared between a first memory channel and a second memory channel. Timing diagram 800 includes clock timing 801, chip select 811, chip select 821, command timing 802, address timing 803, memory channel 1 data (C1 DQ) 810, and memory channel 2 data (C1 DQ) 810. In one exemplary implementation, timing diagram 800 is associated with auto pre-charge command operations. Utilizing the auto pre-charge enables command cycles that would otherwise be tied up by dedicated pre-charge commands to be used for additional data accesses (e.g., via a second data memory channel, etc.). As illustrated, the shared command/control lines are occupied by command/control signals associate with the first memory channel from times T1 to T3, T5 to T7, T9 to T11, and so on.

The shared command/control lines are occupied by command/control signals associate with the second memory channel from times T3 to T5, T7 to T9, and so on. A first set of data bits 871 are accessed from time T5 to time T9 via the first memory channel, a second set of data bits 872 are accessed from time T9 to time T13 via the first memory channel, and a third set of data bits 873 are accessed from time T13 to time T17 via the first memory channel. A different first set of data bits 881 are accessed from time T7 to time T11 via the second memory channel, a different second set of data bits 872 are accessed from time T11 to time T15 via the second memory channel.

In one exemplary implementation, a memory controller (e.g., 120, 205, etc.) communicates with respective ones of the plurality of narrow memory channels with a close page policy. Since some applications with relatively small access widths also have poor locality characteristics. Poor locality characteristics often means there is less chance of using additional information in a page. Thus, automatically closing the page and using auto-pre-charge provides an opportunity to save additional time. A memory controller can implement a method to control two individual memory channels at the same time or coincidentally.

As indicated in FIG. 8, with respect to the first memory channel data transmission shown by C1 DQ810 the first set of data 871 begins transmission based on ACT command processed at time T1 and WRA command processed at time T2 and the second set of data 872 begins transmission based on ACT command processed at time T5 and WRA command processed at time T6. If the command/control signals were not being shared the commands/controls associated with the second memory channel data would not be processed (ACT command would not be processed at time T3 and WRA command would not be processed at time T4). Thus, the data access for data 781 would take 4 cycles (e.g., cycles beginning at T5 to T9, etc.) but the command/control would only take two cycles (e.g., cycles beginning at T1 and T2, etc.). If the command/control communication lines were not being shared the command/control signals or lines would be "idle" for two cycles (e.g., cycles beginning at T3 and T4, etc.). However, since the command/control communication lines are being shared between the first memory channel and the second memory channel, command/control signals for the second memory channel can be transmitted in otherwise "idle" time. Command/control signals for the second memory channel can be transmitted in on the shared command/control lines (e.g., during cycles beginning at T3 and T4, etc.).

In one embodiment, chip select signals are utilized to let a memory chip know whether to participate in a memory access operation based upon information/signals on shared command/control lines or to ignore information/signals on shared command/control lines. In one exemplary implementation, when an unshared chip select signal/line associated with a first memory channel is asserted, the memory chips associated with the first memory channel perform memory access operation based upon signals/information on the shared command/control communication lines. When an unshared chip select signal/line associated with a first memory channel is not asserted, the memory chips associated with the first memory channel ignores signals/information on the shared command/control communication lines. In one exemplary implementation, when an unshared chip select signal/line associated with a second memory channel is asserted, the memory chips associated with the second memory channel perform memory access operation based upon signals/information on the shared command/control communication lines. When an unshared chip select signal/line associated with a second memory channel is not asserted, the memory chips associated with the second memory channel ignores signals/information on the shared command/control communication lines.

In one embodiment, configuration of a memory card/module can be customized. The memory card/module can be customized to be compatible with a narrow channel interface and configurable memory controller. The traces or lines in a memory card/module (e.g., DRAM DIMM, DRAM SIMM, etc.) can be configured so that a customized interface of the memory card/module communicatively coupled to a narrow memory channel is compatible with conveying signals to a commodity memory chip included on the memory card/module. In one exemplary implementation, the memory chip can be compatible with various industry standards (e.g., JEDEC, etc.). It is appreciated a customizable memory controller, a narrow memory channel, and a memory card/module can be configured to be compatible with various memory chip configurations (e.g., X4, X8, X16, etc.). It is also appreciated a customizable memory controller, a narrow memory channel, and a memory card/module can be configured to be compatible with various data width channels and shared command/control and address buses.

Figure 9:
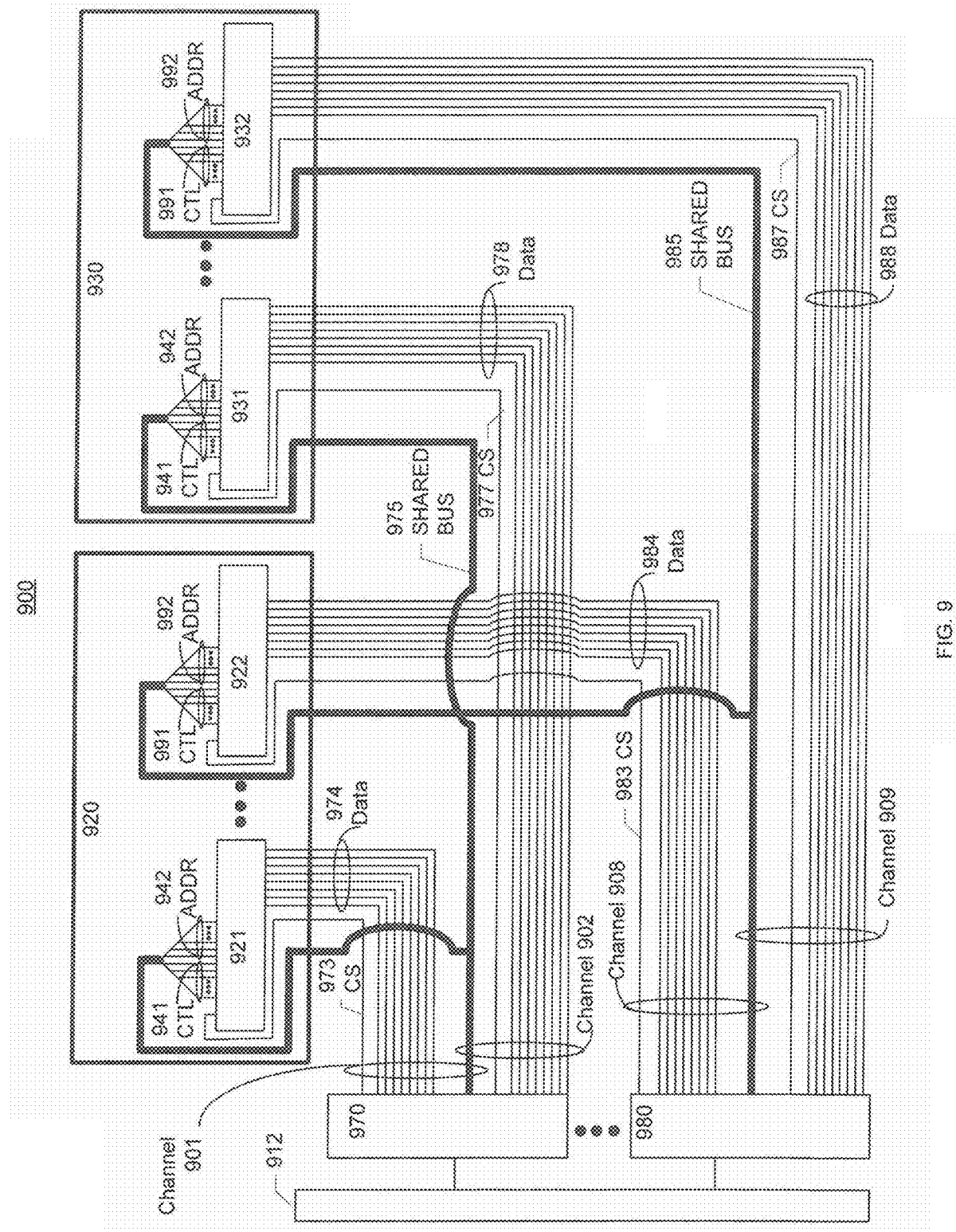
FIG. 9 is a block diagram of exemplary an X8 data width memory system in accordance with one embodiment.

FIG. 9 is a block diagram of exemplary memory system 900 in accordance with one embodiment. Memory system 900 includes MUX/DeMUX 912, memory controller 970, memory controller 980, memory card/module 920, and memory card/module 930. In one embodiment, memory controller 970 and memory controller 980 are similar to memory controller 305.

Memory card/module 920 includes memory chips 921 and 922. Memory chip 921 is communicatively coupled to memory controller 970 via memory channel 901. Memory channel 901 includes unshared data lines 974, unshared command/control line chip select 973, and shared command/control/address lines 975. In one embodiment, command/control/address lines 975 are separate lines configured to communicate command/control signals 941 and address signals 942 to chip 921. Memory chip 922 is communicatively coupled to memory controller 980 via memory channel 908. Memory channel 908 includes unshared data lines 984, unshared command/control line chip select 983, and shared command/control/address lines 985. In one embodiment, command/control/address lines 985 are separate lines configured to communicate command/control signals 991 and address signals 992 to chip 922.

Memory card/module 930 includes memory chips 931 and 932. Memory chip 931 is communicatively coupled to memory controller 970 via memory channel 902. Memory channel 902 includes unshared data lines 978, unshared command/control line chip select 977, and shared command/control lines 985. In one embodiment, command/control/address lines 975 are separate lines configured to communicate command/control signals 941 and address signals 942 to chip 931. Memory chip 932 is communicatively coupled to memory controller 980 via memory channel 909. Memory channel 909 includes unshared data lines 988, unshared command/control line chip select 977, and shared command/control lines 985. In one embodiment, command/control/address lines 985 are separate lines configured to communicate command/control signals 997 and address signals 998 to chip 932.

Figure 10:
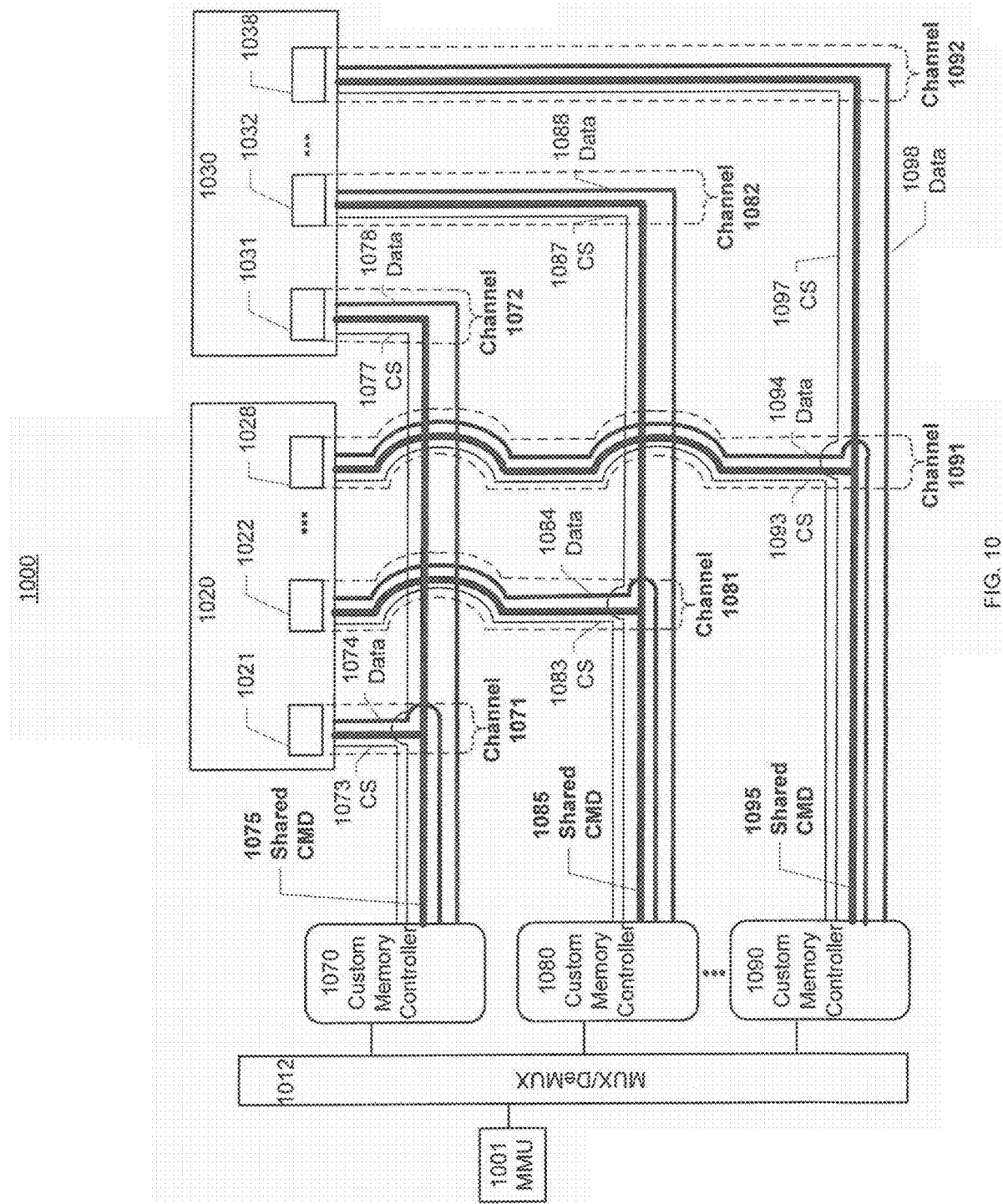
FIG. 10 is a block diagram of exemplary memory system in accordance with one embodiment.

FIG. 10 is a block diagram of exemplary memory system 1000 in accordance with one embodiment. Memory system 1000 includes MUX/DeMUX 1012, memory controller 1070, memory controller 1080, memory controller 1090, memory card/module 1020, and memory card/module 1030. In one embodiment, memory controller 1070, memory controller 1080, and memory controller 109 are similar to customizable memory controller 305. Memory Management unit (MMU) 102 is coupled to MUX/DeMUX 1012.

Memory card/module 1020 includes memory chips 1021 and 922. Memory chip 921 is communicatively coupled to memory controller 1070 via memory channel 1071. Memory channel 1071 includes unshared data lines 1074, unshared command/control line chip select 1073, and shared command/control and address lines 1075. Memory chip 1022 is communicatively coupled to memory controller 1080 via memory channel 1081. Memory channel 1081 includes unshared data lines 1084, unshared command/control line chip select 1083, and shared command/control lines 1085. Memory chip 1028 is communicatively coupled to memory controller 1090 via memory channel 1091. Memory channel 1091 includes unshared data lines 1094, unshared command/control line chip select 1093, and shared command/control lines 1095.

Memory card/module 1030 includes memory chips 1031, 1032. Memory chip 1031 is communicatively coupled to memory controller 1070 via memory channel 1072. Memory channel 1072 includes unshared data lines 1078, unshared command/control line chip select 1077, and shared command/control and address lines 1075. Memory chip 1032 is communicatively coupled to memory controller 1080 via memory channel 1082. Memory channel 1082 includes unshared data lines 1088, unshared command/control line chip select 1087, and shared command/control and address lines 1085. Memory chip 1038 is communicatively coupled to memory controller 1090 via memory channel 1092. Memory channel 1092 includes unshared data lines 1098, unshared command/control line chip select 1097, and shared command/control lines and address lines 1095.

Figure 11:
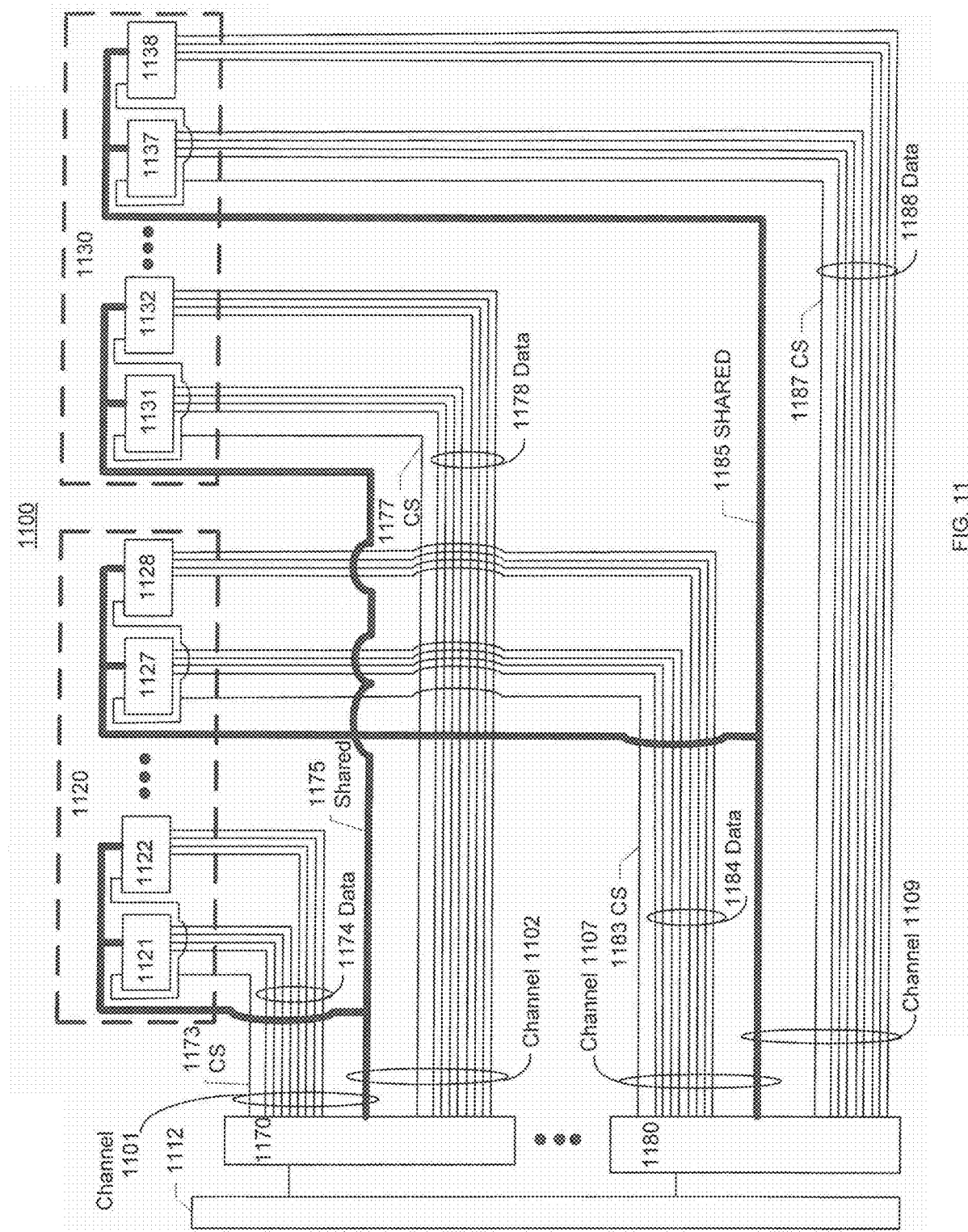
FIG. 11 is a block diagram of exemplary X4 data width memory system in accordance with one embodiment.

FIG. 11 is a block diagram of exemplary memory system 1100 in accordance with one embodiment. Memory system 1100 includes MUX/DeMUX 1112, memory controller 1170, memory controller 1180, memory card/module 1120, and memory card/module 1130. In one embodiment, memory controller 1170 and customizable memory controller 980 are similar to memory controller 305. In one exemplary implementation, memory chips 121, 11122, 127, 18, 1131, 1132, 1137, and 1138 are X4 DRAM chips. The memory chips can have external data bus pins that are 4 bits of data wide.

In one embodiment, a memory communication memory channel can be coupled to more than one chip on a memory card/module (e.g., DIMM, SIMM, etc.). In one embodiment, a communication line that is unshared between different memory channels can be shared within a memory channel. In one exemplary implementation, a chip select signal can be shared with more than one memory chip. In FIG. 11 chip select (CS) signal 1173 is coupled to or shared between chips 1112 and 1122, chip select (CS) signal 1177 is coupled to or shared between chips 1131 and 1132, chip select (CS) signal 1183 is coupled to or shared between chips 1127 and 1128, and chip select (CS) signal 1187 is coupled to or shared between chips 1137 and 1138, Memory card/module 1120 includes memory chips 1121, 1122, 1127, and 1128. Memory chips 1121 and 1122 are communicatively coupled to memory controller 1170 via memory channel 1101. Memory channel 1101 includes unshared data lines 1174, unshared command/control line chip select 1173, and shared command/control and address lines 1175. Memory chips 1127 and 1128 are communicatively coupled to memory controller 1180 via memory channel 1107. Memory channel 1107 includes unshared data lines 1184, unshared command/control line chip select 1183, and shared command/control and address lines 1185.

Memory card/module 1130 includes memory chips 1131, 1132, 1137, and 1138. Memory chips 1131 and 1132 are communicatively coupled to memory controller 1180 via memory channel 1102. Memory channel 1102 includes unshared data lines 1184, unshared command/control line chip select 1183, and shared command/control and address lines 1185. Memory chips 1127 and 1128 are communicatively coupled to memory controller 1180 via memory channel 1107. Memory channel 1107 includes unshared data lines 1184, unshared command/control line chip select 1183, and shared command/control lines 1185.

Figure 12:
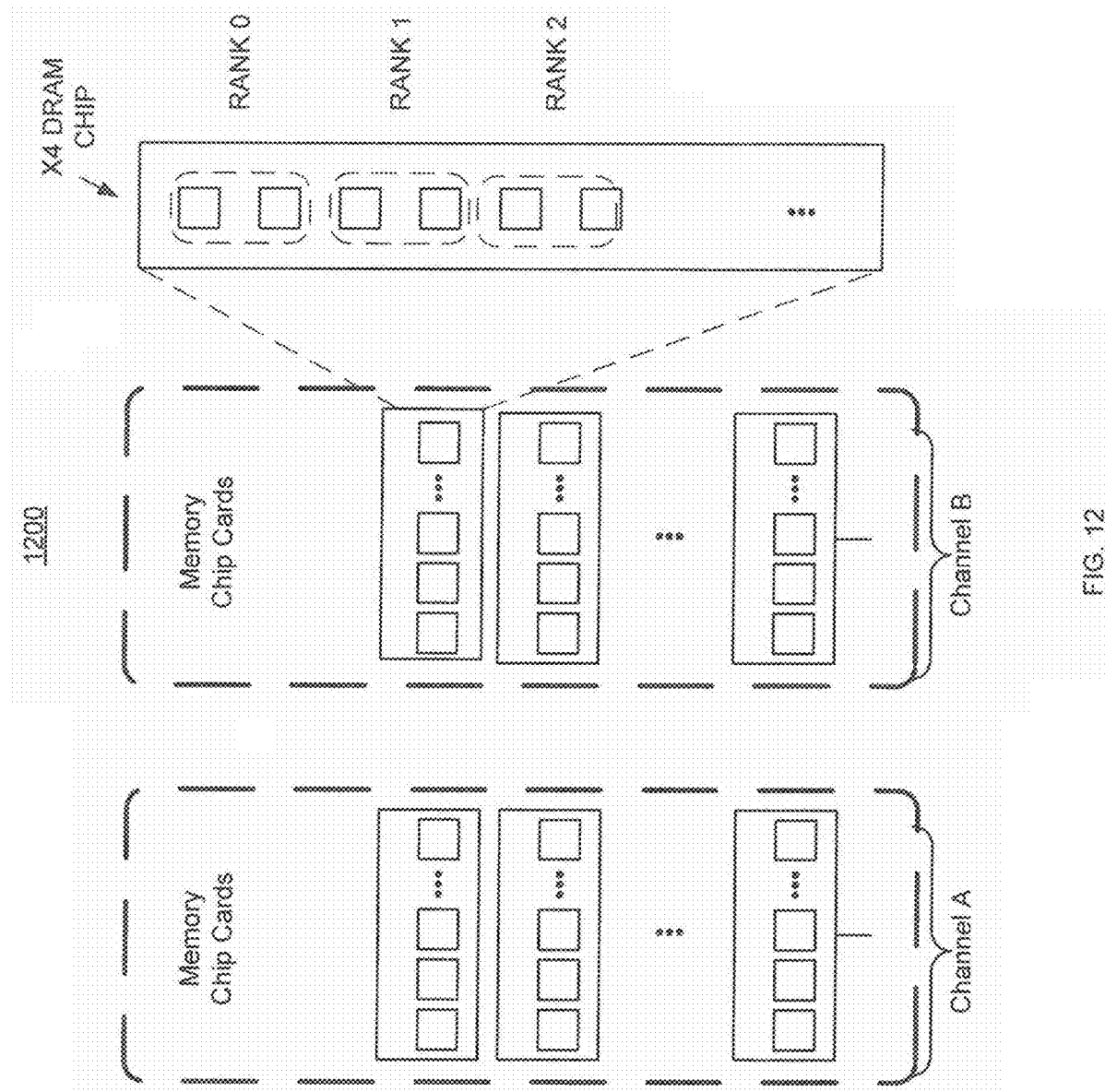
FIG. 12 is a block diagram of an exemplary X4 memory module/card configuration in accordance with one embodiment.

FIG. 12 is a block diagram of an exemplary memory chip card/modules in accordance with one embodiment. In one exemplary implementation, the memory chip card/modules are in a X4 DRAM chip configuration, in which two memory chips are included in ranks 0, 1, and 2 per respective memory chip card/module.

Figure 13:
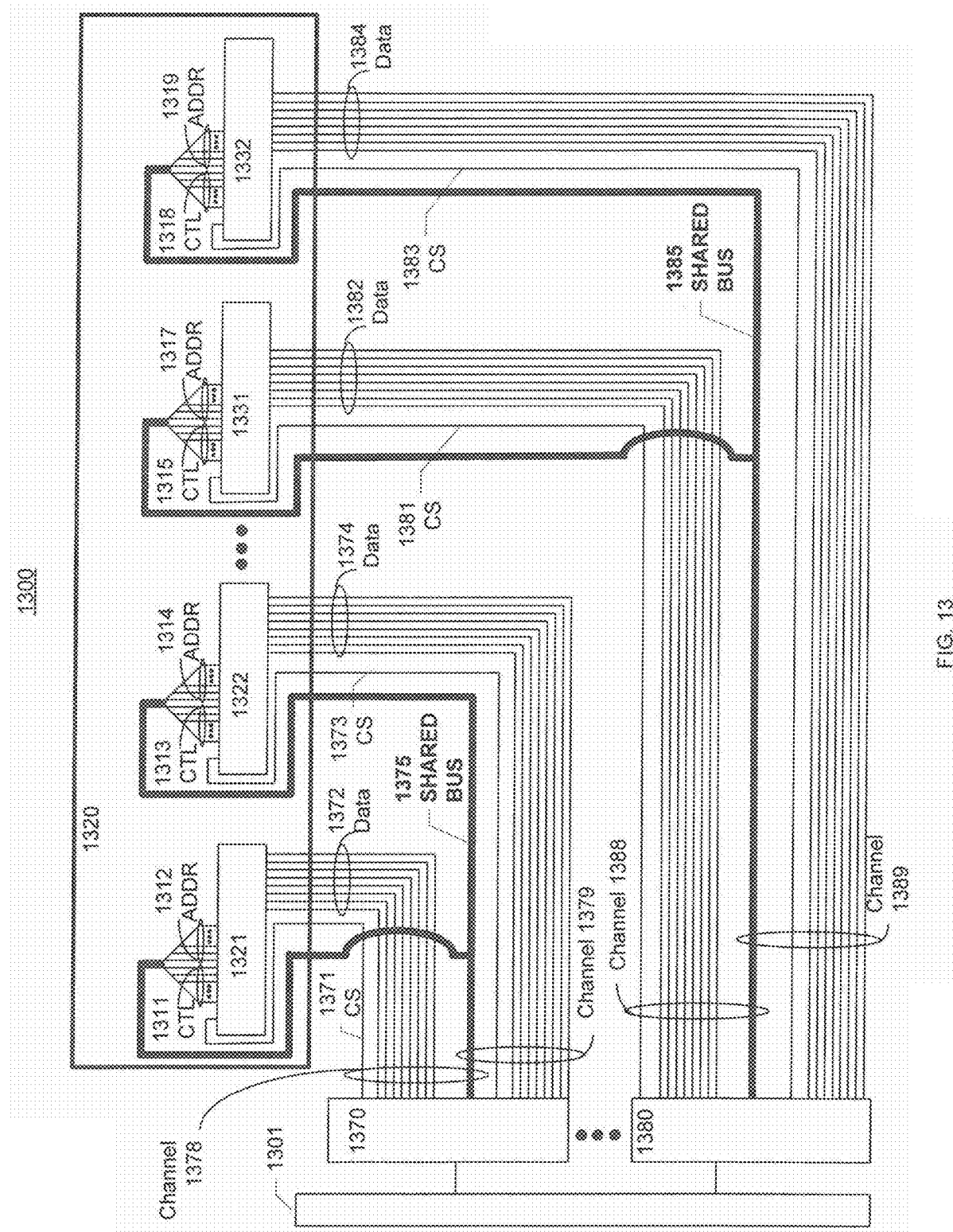
FIG. 13 is a block diagram of exemplary X8 data width memory system communicatively coupled to a memory card/module in accordance with one embodiment.

FIG. 13 is a block diagram of exemplary memory system 1300 in accordance with one embodiment. Memory system 1300 includes MUX/DeMUX 1312, memory controller 1370, memory controller 1380, memory card/module 1320, and memory card/module 1330. In one embodiment, memory controller 1370 and memory controller 1380 are similar to memory controller 305.

Memory card/module 1320 includes memory chips 1321, 1322, 1331, and 1332. Memory chip 1321 is communicatively coupled to memory controller 1370 via memory channel 1378. Memory channel 1378 includes unshared data lines 1372, unshared command/control line chip select 1371, and shared command/control/address lines 1375. Memory chip 1322 is communicatively coupled to memory controller 1370 via memory channel 1379. Memory channel 1379 includes unshared data lines 1374, unshared command/control line chip select 1372, and shared command/control/address lines 1375. In one embodiment, command/control/address lines 1375 are separate lines configured to communicate command/control signals 1311 and address signals 1312 to chips 1321 and 2322. Memory chip 1331 is communicatively coupled to memory controller 1380 via memory channel 1388. Memory channel 1388 includes unshared data lines 1382, unshared command/control line chip select 1381, and shared command/control/address lines 1385. Memory chip 1332 is communicatively coupled to memory controller 1380 via memory channel 1389. Memory channel 1389 includes unshared data lines 1384, unshared command/control line chip select 1383, and shared command/control/address lines 1385. In one embodiment, command/control/address lines 1385 are separate lines configured to communicate command/control signals 1397 and address signals 1398 to chip 1332.

Figure 14:
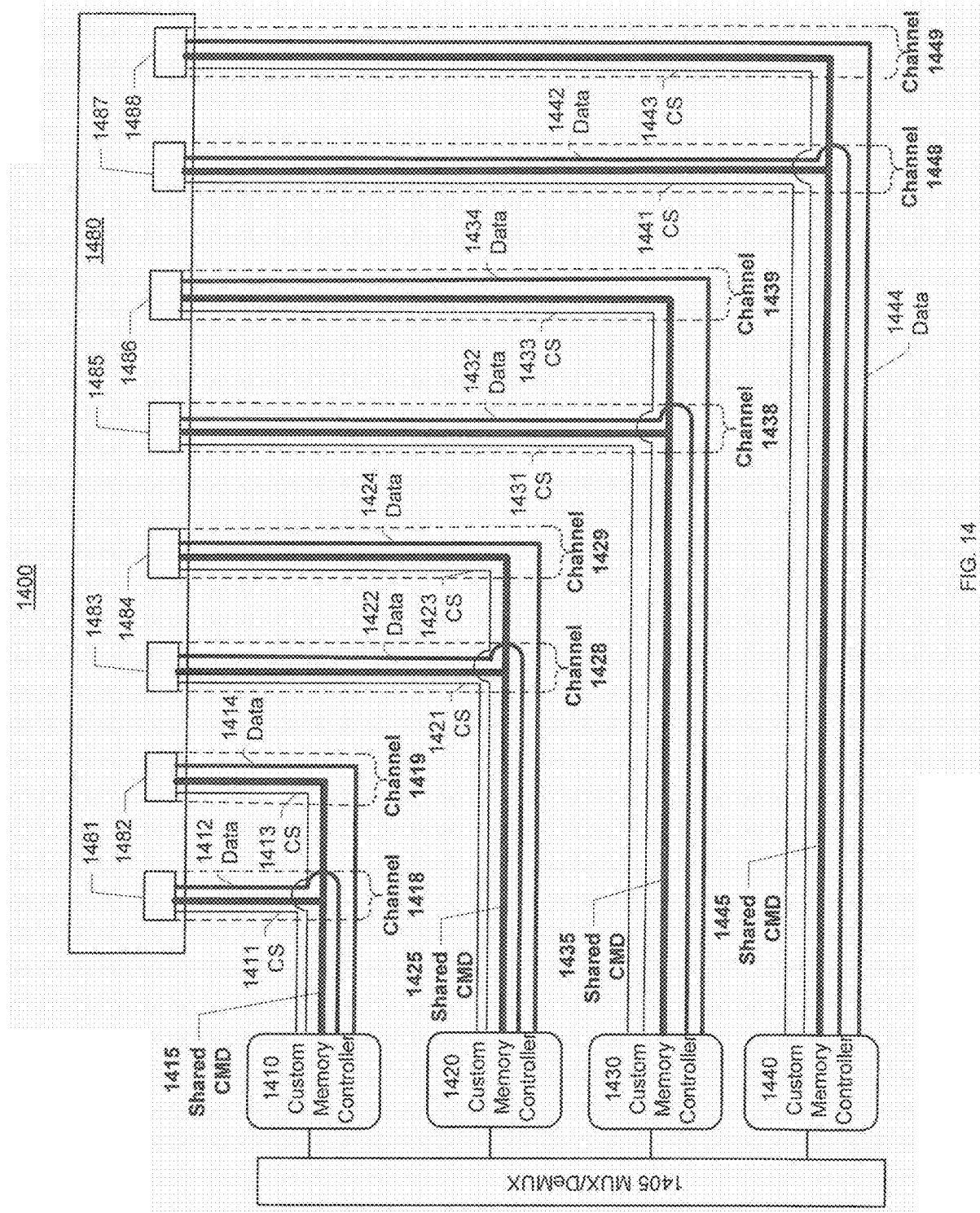
FIG. 14 is a block diagram of exemplary memory system X8 data width memory system with eight memory chips on a memory card/module in accordance with one embodiment.

FIG. 14 is a block diagram of exemplary memory system 1400 in accordance with one embodiment. Memory system 1400 includes MUX/DeMUX 1405, memory controller 1410, memory controller 1420, memory card/module 1420, and memory card/module 1430. In one embodiment, memory controller 1470 and memory controller 1480 are similar to memory controller 305.

Memory card/module 1410 includes memory chips 1481, 1482, 1483, 1484, 1485, 1486, 1487, and 1488. Memory chip 1481 is communicatively coupled to memory controller 1410 via memory channel 1418. Memory channel 1418 includes unshared data lines 1412, unshared command/control line chip select 1411, and shared command/control/address lines 1415. Memory chip 1482 is communicatively coupled to memory controller 1410 via memory channel 1419. Memory channel 1419 includes unshared data lines 1414, unshared command/control line chip select line 1413, and shared command/control/address lines 1415. Memory chip 1483 is communicatively coupled to memory controller 1420 via memory channel 1428. Memory channel 1428 includes unshared data lines 1422, unshared command/control line chip select 1421, and shared command/control/address lines 1425. Memory chip 1484 is communicatively coupled to memory controller 1420 via memory channel 1429. Memory channel 1429 includes unshared data lines 1424, unshared command/control line chip select line 1423, and shared command/control/address lines 1425. Memory chip 1485 is communicatively coupled to memory controller 1430 via memory channel 1438. Memory channel 1438 includes unshared data lines 1432, unshared command/control line chip select 1431, and shared command/control/address lines 1435. Memory chip 1486 is communicatively coupled to memory controller 1430 via memory channel 1439. Memory channel 1439 includes unshared data lines 1434, unshared command/control line chip select line 1433, and shared command/control/address lines 1435. Memory chip 1487 is communicatively coupled to memory controller 1440 via memory channel 1448. Memory channel 1448 includes unshared data lines 1442, unshared command/control line chip select 1441, and shared command/control/address lines 1445. Memory chip 1488 is communicatively coupled to memory controller 1440 via memory channel 1449. Memory channel 1449 includes unshared data lines 1344, unshared command/control line chip select line 1443, and shared command/control/address lines 1445.

Figure 15:
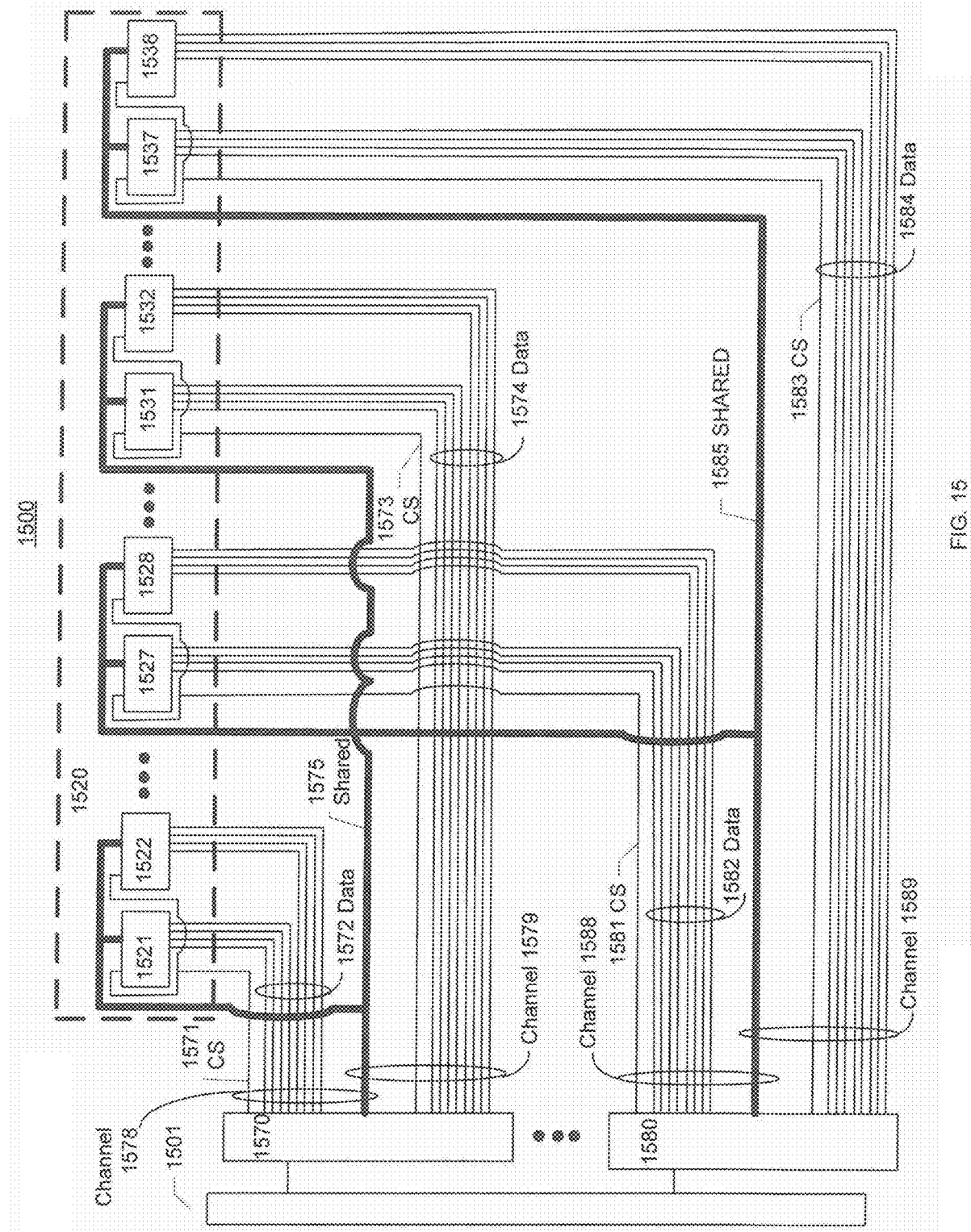
FIG. 15 is a block diagram of exemplary X4 data width memory system communicatively coupled to a memory card/module in accordance with one embodiment.

FIG. 15 is a block diagram of exemplary memory system 1500 in accordance with one embodiment. Memory system 1500 includes MUX/DeMUX 1501, memory controller 1570, memory controller 1580, and memory card/module 1520, In one embodiment, memory controller 1570 and memory controller 1580 are similar to memory controller 305. Memory card/module 1520 includes memory chips 1521, 1522, 1527,1528, 1531, 1532, and 1537, and 1538. Memory chips 1521 and 1522 are communicatively coupled to memory controller 1570 via memory channel 1578. Memory channel 1578 includes unshared data lines 1572, unshared command/control line chip select 1571, and shared command/control/address lines 1575. Memory chips 1527 and 1528 are communicatively coupled to memory controller 1580 via memory channel 1588. Memory channel 1588 includes unshared data lines 1582, unshared command/control line chip select 1581, and shared command/control/address lines 1585. Memory chips 1531 and 1532 are communicatively coupled to memory controller 1570 via memory channel 1579. Memory channel 1598 includes unshared data lines 1574, unshared command/control line chip select 1573, and shared command/control/address lines 1575. Memory chips 1537 and 1538 are communicatively coupled to memory controller 1580 via memory channel 1589. Memory channel 1589 includes unshared data lines 1584, unshared command/control line chip select 1583, and shared command/control/address lines 1585.

It is appreciated that lines on the figures can represent more than one communication line. A line on the figures can represent a communication bus comprising a plurality of communication lines. In one embodiment, shared lines (e.g., 1075, 1085, 1175, 1185, 1415, 1445, etc.), unshared lines, 1073, 1183,14,11, etc.), and data lines (e.g., 1174, 1414, 1074, etc.) can represent more than one communication line.

FIG. 16 is a flow chart of memory control method 1600 in accordance with one embodiment. In one embodiment, memory channel method is implemented in a memory system (e.g., 100, 200, 300, etc.)

In block 1610 memory access requests are received that are directed to a plurality of memory components.

In block 1620, accesses to respective memory components are managed. In one embodiment, the managing the access includes developing memory access directions. In one exemplary implementation, the memory access directions comprise instructions for access via a plurality of memory channels. The memory channels can include a first channel and a second memory channel. The first memory channel and second memory channel can be narrow memory channels (e.g., narrow width data bus, shared command/address lines, etc.). In one embodiment, the memory channels comprise communication lines, wherein the communication lines include data lines, control lines, and address lines. A portion of the control lines and the address lines can be included in and shared between multiple memory channels. In one embodiment, managing accesses includes initiating an auto pre-charge. In one exemplary implementation, managing accesses includes preserving a slot on a command line and balancing command/data bus utilization. A command/control link can be shared for a plurality of separate dedicated data links. The command/control link can be shared between multiple memory channels In block 1630, the memory access information is forwarded to the respective memory components. In one embodiment, the memory access information includes memory access directions developed in block 1620.

In one embodiment, because there are multiple FSMs in the memory controller there is a mask to help organize putting the commands on the appropriate memory channel in the appropriate manner. The memory controller can include arbitration logic to balance data access between the multiple memory channels. The memory controller can include artificial intelligence that monitors and balances memory accesses. In one embodiment, the utilization of the memory channels is intentionally unbalanced from 50% to one memory channel and 50% to the other memory channel. The selection or utilization of a memory channel can be based upon various factors (e.g., the application that is running on a host processor, the width of the respective channels, granularity of an access, locality characteristics, the type of memory, etc.). In one exemplary implementation, a memory controller can use WRA/RDA instead of WR/RD to provide balanced command/data bus utilization.

Figure 17:
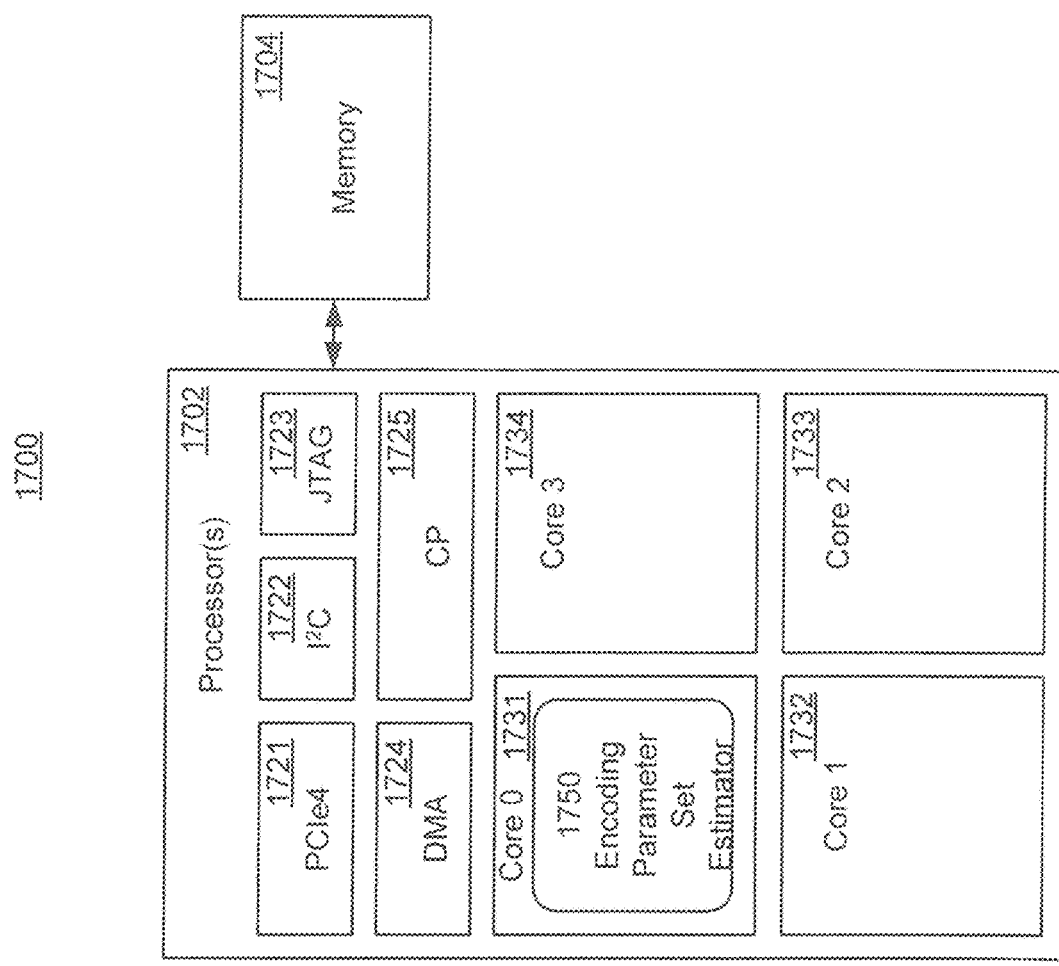
FIG. 17 is a block diagram of an exemplary computing system in accordance with one embodiment.

FIG. 17 is a block diagram of an exemplary computing system 1700 for processing content in accordance with one embodiment. In one embodiment, computing system 1700 participates in a memory control method (e.g., similar to memory control method 1300, etc.). The computing system 1700 can include processors 1702 and memory 1704. In one implementation, the computing system 1700 can be a server computer, a data center, a cloud computing system, a stream service system, an internet service provider system, a cellular service provider system, or the like. The processors 1702 can be central processing units (CPU), graphics processing units (GPU), neural processing units (NPU), vector processors, memory processing units, or the like, or combinations thereof. In one implementation, a processor 1702 can include communication interfaces, such as peripheral component interface (PCIe4) 1721 and inter-integrated circuit ($I^2C$) interface 1733, an on-chip circuit tester, such as a joint test action group (JTAG) engine 1723, a direct memory access engine 1724, a command processor (CP) 1725, and cores 1731-1734. The cores 1731-1734 can be coupled in a direction ring bus configuration.

Referring still to FIG. 17, the cores 1731-1734 can execute sets of computing device executable instructions to perform functions including, but not limited to performing a narrow channel conversion memory control method. The functions can be performed on individual core 1731-1734, can be distributed across a plurality of cores 1731-1734, can be performed along with other functions on cores, and or the like.

Figure 18:
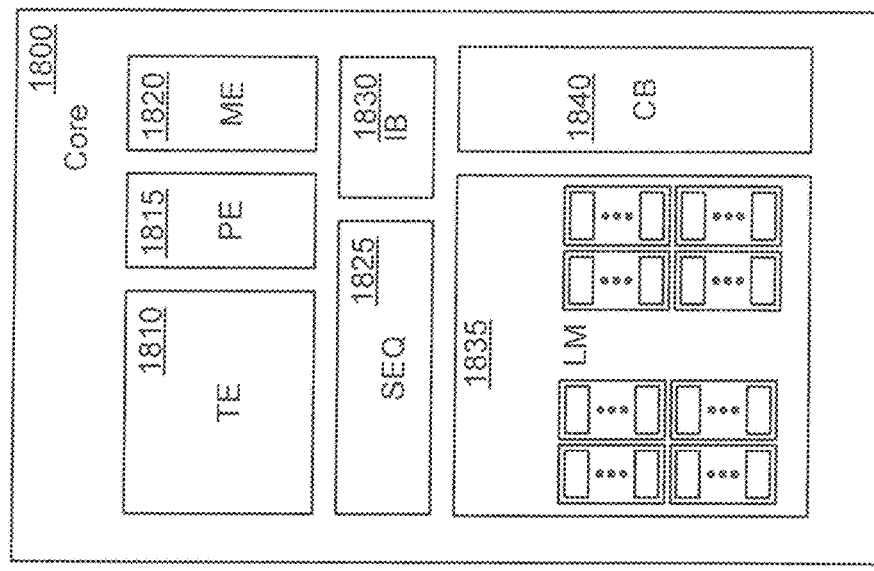
FIG. 18 is a block diagram of an exemplary processing core configuration in accordance with one embodiment.

FIG. 18 is a block diagram of an exemplary processing core configuration 1800 in accordance with one embodiment. In one embodiment, components of processing core configuration 1800 participate in a memory control method (e.g., similar to memory control method 1300, etc.). The processing core 1800 can include a tensor engine (TE) 1810, a pooling engine (PE) 1815, a memory copy engine (ME) 1820, a sequencer (SEQ) 1825, an instructions buffer (IB) 1830, a local memory (LM) 1835, and a constant buffer (CB) 1840. The local memory 1835 can be pre-installed with model weights and can store in-use activations on-the-fly. The constant buffer 1840 can store constant for batch normalization, quantization and the like. The tensor engine 1810 can be utilized to accelerate fused convolution and or matrix multiplication. The pooling engine 1815 can support pooling, interpolation, region-of-interest and the like operations. The memory copy engine 1820 can be configured for inter- and or intra-core data copy, matrix transposition and the like. The tensor engine 1810, pooling engine 1815, and memory copy engine 1820 can run in parallel. The sequencer 1829 can orchestrate the operation of the tensor engine 1810, the pooling engine 1815, the memory copy engine 1820, the local memory 1839, and the constant buffer 1840 according to instructions from the instruction buffer 1830. The processing core 1800 can provide video coding efficient computation under the control of operation fused coarse-grained instructions. A detailed description of the exemplary processing unit core 1800 is not necessary to an understanding of aspects of the present technology, and therefore will not be described further herein.

The systems and methods can be implemented without changing DRAM signals or memory design. They can reduce average access latency, improve memory bandwidth utilization, and reduce address pin counts. In one embodiment, the systems and methods are compatible with commodity DRAMs enabling utilization of a similar set of DRAM signals and implementation of the system and methods without a need for memory chip design. The systems and methods can be random access friendly (e.g., by utilizing closed page policy, etc.) which can facilitate reduced average access latency. The systems and methods use smaller access granularity corresponding to the narrower channels which can improve memory bandwidth utilization. The systems and methods can include multiple memory channels per memory controller with shared command buses between channels and separated data buses between channels enabling reduction of pin counts. In one exemplary implementation, address pin counts are reduced by 50%.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A memory controller comprising;
    a request queue configured to receive memory access requests;
    a buffer configured to buffer data associated with the memory access requests;
    a control component configured to process the memory access requests directed to a random access memory (RAM), wherein commands, address, and data associated with the memory access requests are configured by the control component based upon communications between the control component and a first narrow memory channel and a second narrow memory channel, wherein the first narrow memory channel and the second narrow memory channel comprise communication lines including data communication lines, command/control communication lines, and address communication lines, and wherein a portion of the command/control communication lines and the address communication lines are included in and shared between the first narrow memory channel and the second narrow memory channel, wherein the memory access requests and commands associated with the memory access requests are communicated via the first narrow memory channel and the second narrow memory channel; and
    a data path system configured to process data associated with the plurality of access requests, wherein the data path system includes a first data module associated with the first narrow memory channel and a second data module associated with the second narrow memory channel, wherein a respective width of the first narrow memory channel is equal to a first rank bit width of the random access memory (RAM) and a respective width of the second narrow memory channel is equal to a second rank bit width of the random access memory (RAM).

2. The memory controller of claim 1, wherein the control component comprises:
    a first finite state machine associated with the first narrow memory channel; and
    a second finite state machine associated with the second narrow memory channel.

3. The memory controller of claim 1, wherein the data path system comprises
    a first data module associated with the first narrow memory channel; and
    a second data module associated with the second narrow memory channel.

4. The memory controller of claim 1, wherein directions for the memory access requests directed respectively to the first narrow memory channel and the second narrow memory channel are multiplexed on the shared portion of the command/control communication lines.

5. The memory controller of claim 1, further comprising a signal generator to generate command/control signals.

6. The memory controller of claim 1, wherein the memory controller communicates with the first narrow memory channel and the second narrow memory channel in accordance with a close page policy.

7. The memory controller of claim 1, wherein the memory controller uses an auto pre-charge command to preserve a slot on the command bus for use by another access command.

8. The memory controller of claim 2, wherein the memory controller controls the first narrow memory channel and the second narrow memory channel independently and concurrently.

9. A memory control method comprising:
receiving memory access requests that are directed to a plurality of memory components, wherein the memory access requests are received by a memory controller;
managing accesses to respective ones of the plurality of memory components including developing memory access directions, wherein the memory access directions include instructions for access via a plurality of memory channels comprising a first narrow memory channel and a second narrow memory channel, wherein the first narrow memory channel and the second narrow memory channel comprise communication lines, wherein the communication lines include data lines, command/control lines, and address lines, and wherein a portion of the command/control lines and the address lines are included in and shared between the first narrow memory channel and the second narrow memory channel, wherein the managing accesses includes initiating an auto pre-charge command and the auto pre-charge command is configured to preserve slots on the command bus and the slots facilitate balanced command bus and data bus utilization, wherein the accesses are managed by the memory controller; and
forwarding memory access information to the respective memory components, including the memory access directions, wherein the memory access information is forwarded by the memory controller.

10. The memory control method of claim 9, further comprising sharing a command link for plurality of separate unshared dedicated data links.

11. The memory control method of claim 9, further comprising sharing a command/control link between multiple memory channels.

12. A memory system, comprising:
a first narrow memory channel configured to communicate with a first portion of random access memory (RAM), wherein the first narrow memory channel is associated with a first unshared portion of communication lines and a first shared portion of communication lines, wherein a respective width of the first narrow memory channel is equal to a bit width of a first rank of the random access memory (RAM);
a second narrow memory channel configured to communicate with a second portion of random access memory (RAM), wherein the second narrow memory channel is associated with a second unshared portion of communication lines and the first shared portion of communication lines, wherein the first shared portion of communication lines is shared by the first narrow memory channel and the second narrow memory channel, wherein a respective width of the second narrow memory channel is equal to a bit width of a second rank of the random access memory (RAM); and
a first memory controller configured to direct communication with the first portion of memory via the first narrow memory channel and direct communication with the second portion of memory via the second narrow memory channel, wherein the first rank includes memory locations in a first set of IC chips that share a first chip select signal and the second rank includes memory location in a second set of IC chips that share a second chip select signal, wherein the first chip select signal and the second chip select signal are unshared between the first narrow memory channel and second narrow memory channel and communicated respectively via the first unshared portion of communication lines and the second unshared portion of communication lines.

13. The memory system of claim 12 wherein:
the first unshared portion of communication lines in the first narrow memory channel are associated with a first unshared set of data communication lines and a first unshared set of command/control lines;
the first shared portion of communication lines in the first narrow memory channel are associated with a set of shared command/control lines and a set of shared address lines;
the second unshared portion of communication lines in the second narrow memory channel are associated with a second unshared set of data communication lines and a second unshared set of command/control lines; and
the second shared portion of communication lines in the second narrow memory channel are associated with the set of the shared command/control lines and the set of shared address lines.

14. The memory system of claim 13 wherein the first unshared set of command/control lines includes a first chip select and the wherein the second unshared set of command/control lines includes a second chip select.

15. A memory system of claim 12 further comprising:
a third narrow memory channel configured to communicate with a third portion of memory, wherein the third narrow memory channel is associated with a third unshared portion of communication lines and a second shared portion of communication lines;
a fourth narrow memory channel configured to communicate with a fourth portion of memory wherein the fourth narrow memory channel is associated with a fourth unshared portion of communication lines and the second shared portion of communication lines; and
a second memory controller configured to direct communication with the third portion of memory via the third narrow memory channel and direct communication with the fourth portion of memory via the fourth narrow memory channel.

16. A memory system of claim 1 wherein the first memory controller and the second memory controller are included in a system memory controller, wherein the system memory controller includes a MUX/DeMUX configured to coordinate communications to and from a memory management unit.

17. A memory system of claim 1 wherein the first memory controller and the second memory controller are included in a system memory controller, wherein the system memory controller is coupled to a memory management unit configured to translate between virtual memory addresses and physical memory addresses.

* * * * *